United States Patent
Price et al.

(10) Patent No.: US 10,418,954 B1
(45) Date of Patent: Sep. 17, 2019

(54) SINGLE CONTROLLER AUTOMATIC CALIBRATING CIRCUITS FOR REDUCING OR CANCELING OFFSET VOLTAGES IN OPERATIONAL AMPLIFIERS IN AN INSTRUMENTATION AMPLIFIER

(71) Applicant: QUALCOMM Incorporated, San Diego, CA (US)

(72) Inventors: Burt Lee Price, Apex, NC (US); Jin Liang, Apex, NC (US); Yeshwant Nagaraj Kolla, Wake Forest, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/045,103

(22) Filed: Jul. 25, 2018

Related U.S. Application Data

(60) Provisional application No. 62/660,432, filed on Apr. 20, 2018.

(51) Int. Cl.
*H03F 3/45* (2006.01)
*H03F 1/02* (2006.01)

(52) U.S. Cl.
CPC ........... *H03F 3/45995* (2013.01); *H03F 1/02* (2013.01); *H03F 3/45977* (2013.01); *H03F 2200/375* (2013.01)

(58) Field of Classification Search
CPC ........................................................ H03F 3/45
USPC ........................................ 330/252, 260, 69
See application file for complete search history.

(56) References Cited

U.S. PATENT DOCUMENTS

| 7,321,260 | B2 | 1/2008 | Larson |
| 8,026,761 | B2 | 9/2011 | Nolan et al. |
| 8,111,100 | B1 * | 2/2012 | Pease .................. H03F 3/45475 330/260 |

(Continued)

OTHER PUBLICATIONS

Kitchin, C. et al., "A Designer's Guide to Instrumentation Amplifiers," 3rd Edition, Dec. 31, 2006, Analog Devices, Inc., 130 pages.

(Continued)

*Primary Examiner* — Henry Choe
(74) *Attorney, Agent, or Firm* — W&T/Qualcomm

(57) ABSTRACT

Single controller automatic calibrating circuits for reducing or canceling offset voltages in operational amplifiers (op-amps) in an instrumentation amplifier are disclosed. An automatic calibrating op-amp system is provided that includes an instrumentation amplifier, which includes a front-end amplifier circuit comprising at least one front-end op-amp and a final-stage amplifier circuit comprising a final-stage op-amp. The op-amp(s) can include auxiliary differential inputs for offset voltage cancellation. The automatic calibrating op-amp system also includes an automatic calibration circuit employing a single controller to generate calibration signals on a calibration output to an auxiliary differential input(s) of an op-amp(s) in the instrumentation amplifier for offset voltage cancellation. The automatic calibration circuit includes a single controller to generate calibration signals to the instrumentation amplifier to reduce or cancel offset voltage, thereby eliminating the need to provide multiple automatic calibration circuits or an automatic calibration circuit employing multiple controllers.

30 Claims, 16 Drawing Sheets

(56) References Cited

U.S. PATENT DOCUMENTS

| | | |
|---|---|---|
| 8,624,668 B2 | 1/2014 | Wan et al. |
| 8,723,599 B1* | 5/2014 | Leuciuc ............. H03F 3/45174 |
| | | 327/359 |
| 9,712,126 B2 | 7/2017 | Price et al. |
| 9,780,748 B2 | 10/2017 | Kris et al. |
| 2018/0055409 A1* | 3/2018 | Xu ..................... H03F 3/45475 |

OTHER PUBLICATIONS

International Search Report and Written Opinion for International Patent Application No. PCT/US2019/025126, dated Aug. 6, 2019, 18 pages.

\* cited by examiner

SINGLE CONTROLLER AUTOMATIC CALIBRATING CIRCUITS FOR REDUCING OR CANCELING OFFSET VOLTAGES IN OPERATIONAL AMPLIFIERS IN AN INSTRUMENTATION AMPLIFIER

PRIORITY APPLICATION

The present application claims priority under 35 U.S.C. § 119(e) to U.S. Provisional Patent Application Ser. No. 62/660,432 entitled "SINGLE CONTROLLER AUTOMATIC CALIBRATING CIRCUITS FOR REDUCING OR CANCELING OFFSET VOLTAGES IN OPERATIONAL AMPLIFIERS IN AN INSTRUMENTATION AMPLIFIER" and filed on Apr. 20, 2018, the contents of which is incorporated herein by reference in its entirety.

BACKGROUND

I. Field of the Disclosure

The technology of the disclosure relates generally to instrumentation amplifiers, and more particularly to use of instrumentation amplifiers to sense current in distributed load circuits.

II. Background

Preventing or avoiding excessive current is a problem of increasing concern in integrated circuit (IC) design, particularly because excessive current in an IC can cause circuit failure. This problem has become especially critical as voltage scaling has slowed down and the number of active components per unit area has increased. In this regard, the total current of an IC fabricated on a semiconductor die, such as a microprocessor or cache memory, may be determined or estimated by performing an on-die current measurement of the IC. As a non-limiting example, an on-die current measurement system may employ a precise current sense resistor on the semiconductor die to determine whether the current flowing in the IC exceeds a defined current threshold. If the measured current exceeds the defined current threshold, a control system corresponding to the IC may be configured to perform certain functions that reduce the current so as to avoid circuit failures caused by excessive current.

Although the current of the IC may be measured using an on-die current measurement system on a semiconductor die, accurately measuring current within the IC may be difficult. In particular, because voltage distribution, and hence current distribution, may differ across distributed load circuit elements within an IC, the current profile of a particular area of an IC is not necessarily indicative of the current profile of other areas of the IC or the entire IC. For example, a first current distributed to a first area of an IC may be different from a second current distributed to a second area of the IC. Thus, measuring current in one particular area of an IC may not provide an accurate representation of overall current within the IC. Inaccurate current measurements within the IC may reduce the effectiveness of current control functions employed to prevent circuit failures.

It would be advantageous to more accurately measure current in light of varying voltage and current profiles across distributed elements within an IC. In particular, providing more accurate current measurements may improve results of a corresponding control system that uses the current measurements to adjust the current so as to reduce or avoid circuit failures caused by excessive current.

U.S. patent application Ser. No. 15/672,356 incorporated herein by reference in its entirety discusses a current sensing circuit configured to sense total current of distributed load circuits independent of current distribution using distributed voltage averaging. An example of this is a current sensing circuit 100 shown in FIG. 1. The current sensing circuit 100 is coupled to one or more distributed load circuits 102 receiving a load current $I_{LOAD}$ by a supply voltage $V_{DD}$. The current sensing circuit 100 includes one or more distributed voltage averaging circuits 104 that each include a current sense resistor $R_{SEN}$ for determining average voltages of the distributed load circuits 102 based on voltages of multiple resistive paths corresponding to a distribution network providing power from the supply voltage $V_{DD}$ to the distributed load circuits 102. The current sensing circuit 100 also includes an operational amplifier (op-amp)-based amplifier 106 configured as a differential amplifier, which is configured to provide a ground-referenced (GND) output voltage $V_{OUT}$ correlating to a difference of the average voltages multiplied by a gain of the op-amp-based amplifier 106. The voltage differential of the average voltages is proportional to the total current in the distributed load circuits 102. An analog-to-digital (A/D) converter 108 can be employed to convert the output voltage $V_{OUT}$ to a digital output 110 that can correlate to the total current in the distributed load circuits 102. For example, a current level maximum in the current sensing circuit 100 may be 100 Amps (A). A sense voltage $V_{SENSE}$ across the effective sense resistance may be 10 milliVolts (mV). An effective sense resistance value of the current sense resistor $R_{SEN}$ would then be around 0.1 milliOhms. A voltage gain of around sixty (60) in the op-amp-based amplifier 106 may be required to amplify the sense voltage $V_{SENSE}$ of 10 mV up to around 600 mV for processing by the A/D converter 108.

The op-amp-based amplifier 106 in the current sensing circuit 100 in FIG. 1 receiving a first input voltage $V_1$ and a second input voltage $V_2$, and having an offset voltage $V_{OFFSET}$, generates the output voltage $V_{OUT}$ equal to $A*(V_1-V_2+V_{OFFSET})$, where 'A' represents the gain of the op-amp-based amplifier 106. An offset voltage of the op-amp-based amplifier 106 may cause reduced performance of circuits designed with a low tolerance for variation in the output voltage $V_{OUT}$. For example, the op-amp-based amplifier 106 could have an offset voltage between 1 mV and 10 mV. A 1 mV one-sigma offset voltage would require large input devices for this level of matching and may be difficult to achieve. At least a three-sigma offset voltage may need to be allowed, which would mean a +/−3 mV offset voltage range. Thus in this instance, a 10 mV input sense voltage $V_{SENSE}$ would mean a +/−30% error range, which may not be acceptable for the current sensing application in which the current sensing circuit 100 is employed. Thus, offset voltage mitigation may be needed to achieve low offset in the op-amp-based amplifier 106.

SUMMARY OF THE DISCLOSURE

Aspects disclosed in the detailed description include single controller automatic calibrating circuits for reducing or canceling offset voltages in operational amplifiers (op-amps) in an instrumentation amplifier. For example, the instrumentation amplifier may be used to sense current distributed to a load circuit to measure power consumption. In this regard, in exemplary aspects disclosed herein, an automatic calibrating op-amp system is provided that includes an instrumentation amplifier. The instrumentation amplifier includes a front-end amplifier circuit comprising at least one front-end op-amp and a final-stage amplifier circuit comprising a final-stage op-amp. The front-end op-amp(s) and the final-stage amplifier circuit may have high input impedance, thus making the instrumentation amplifier particularly suited for use in making measurements, such as power consumption. The front-end op-amp(s) is configured to receive respective input voltages and generate intermediate output voltages according to the respective gain of the front-end op-amp(s). The final-stage op-amp is a differential amplifier that is configured to generate a final-stage output voltage representing a difference in the intermediate output voltages from the front-end op-amp(s). In one example, each of the op-amps in the instrumentation amplifier includes auxiliary differential inputs for offset voltage cancellation to reduce or eliminate sensing error. The automatic calibrating op-amp system also includes an automatic calibration circuit employing a single controller to generate calibration signals on a calibration output to an auxiliary differential input(s) of an op-amp(s) in the instrumentation amplifier for offset voltage cancellation. For example, the automatic calibration circuit may employ a successive approximation register (SAR) controller and digital-to-analog converter (DAC) for converting successive digital values from the SAR controller into the calibration signal. The automatic calibration circuit includes a single controller in examples disclosed herein to generate calibration signals to the instrumentation amplifier to cancel offset voltages to eliminate the need to provide multiple automatic calibration circuits or an automatic calibration circuit employing multiple controllers to cancel offset voltages in the instrumentation amplifier.

In one example, to calibrate the instrumentation amplifier using an automatic calibration circuit employing a single controller, the instrumentation amplifier includes a first polarity cross-coupling between auxiliary differential inputs of the at least one front-end op-amp in the front-end amplifier circuit and the calibration signals generated by the automatic calibration circuit. The instrumentation amplifier includes a reverse polarity to the first polarity cross-coupling between the auxiliary differential inputs of a second front-end op-amp in the front-end amplifier circuit and a calibration output of the automatic calibration circuit. This avoids a common-mode of the calibration signals generated on the calibration output by the automatic calibration circuit being coupled to the auxiliary differential inputs of both the first and second front-end op-amps such that their effect on the final-stage output voltage would common-mode out.

In another example, the automatic calibration op-amp system may also include a switchable bias voltage circuit to control the final-stage output voltage in the instrumentation amplifier in a calibration mode to keep the final-stage op-amp in its linear range of operation during calibration for greater accuracy in offset cancellation in the instrumentation amplifier. The final-stage output voltage can be controlled to be a voltage at a bias node in the instrumentation amplifier when the input voltages in the instrumentation amplifier are equal and the offset voltages in the instrumentation amplifier are set to zero. Thus, this allows a bias voltage to be switched on the bias node to force the final-stage output voltage generated by the final-stage op-amp to the bias voltage set at the bias node in the instrumentation amplifier. The automatic calibration circuit will search for and generate the calibration signals on the calibration output to seek the biased final-stage output voltage in the calibration mode. For example, the switched bias voltage may be set to the maximum functional output voltage of the final-stage op-amp to calibrate the calibration signals for offset voltage correction at the maximum functional output voltage of the final-stage op-amp.

In another example, to calibrate the instrumentation amplifier using an automatic calibration circuit employing a single controller, the automatic calibration circuit is coupled to the auxiliary differential inputs of the final-stage op-amp in the final-stage op-amp circuit.

In yet another example, to calibrate the instrumentation amplifier using an automatic calibration circuit employing a single controller, the automatic calibration circuit is coupled to the auxiliary differential inputs of a front-end op-amp in the front-end amplifier circuit and a final-stage op-amp in the final-stage amplifier circuit.

In this regard in one aspect, an instrumentation amplifier is provided that comprises a gain resistor circuit coupled between a first resistor circuit node and a second resistor circuit node, and a front-end amplifier circuit. The front-end amplifier circuit comprises a first front-end operational amplifier (op-amp). The front-end op-amp comprises a first front-end voltage input configured to receive a first input voltage on a first voltage input, and a second front-end voltage input coupled to the first resistor circuit node. The front-end op-amp further comprises a first front-end auxiliary differential input pair comprising a first front-end auxiliary differential input coupled to a first calibration input configured to receive a first calibration signal from a calibration circuit, and a second front-end auxiliary differential input coupled to a second calibration input configured to receive a second calibration signal from the calibration circuit, and a first front-end voltage output. The first front-end op-amp is configured to generate a first intermediate output voltage on the first front-end voltage output based on the first input voltage and a voltage at the second front-end voltage input, and a first front-end offset voltage based on the first calibration signal applied to the first front-end auxiliary differential input and the second calibration signal applied to the second front-end auxiliary differential input. The front-end amplifier circuit also comprises a second front-end op-amp. The second front-end op-amp comprises a third front-end voltage input configured to receive a second input voltage on a second voltage input, and a fourth front-end voltage input coupled to the second resistor circuit node. The second-front-end op-amp further comprises a second front-end auxiliary differential input pair comprising a third front-end auxiliary differential input coupled to the second calibration input, and a fourth front-end auxiliary differential input coupled to the first calibration input, and a second front-end voltage output. The second front-end op-amp is configured to generate a second intermediate output voltage on the second front-end voltage output based on the second input voltage, and a voltage at the fourth front-end voltage input and a second front-end offset voltage based on the first calibration signal applied to the fourth front-end auxiliary differential input and the second calibration signal applied to the third front-end auxiliary differential input. The instrumentation amplifier further comprises a final-stage amplifier circuit comprising a final-stage op-amp. The final-stage op-amp comprises a first final-stage voltage input configured to receive a first input voltage, and a second final-stage voltage input coupled to the first resistor circuit node, and a final-stage voltage output. The final-stage op-amp is configured to generate a final-stage output voltage on the final-stage voltage output based on the first intermediate output voltage and the second intermediate output voltage.

In another aspect, an automatic calibrating op-amp system is provided that comprises an instrumentation amplifier. The instrumentation amplifier comprises at least one front-end amplifier circuit. The at least one front-end amplifier circuit comprises a first front-end voltage input configured to receive a first input voltage on a first voltage input, a second front-end voltage input configured to receive a second input voltage on a second voltage input, at least one front-end auxiliary differential input pair, and at least one front-end voltage output. The at least one front-end amplifier circuit is configured to generate at least one intermediate output voltage on the at least one front-end voltage output based on the first input voltage and the second input voltage, and at least one front-end offset voltage based on a plurality of calibration signals applied to the at least one front-end auxiliary differential input pair. The instrumentation amplifier further comprises a final-stage amplifier circuit comprising a final-stage op-amp. The final-stage op-amp comprises a first final-stage voltage input configured to receive a first final-stage input voltage, and a second final-stage voltage input coupled to a first resistor circuit node, a final-stage auxiliary differential input pair, and a final-stage voltage output. The final-stage op-amp is configured to generate a final-stage output voltage on the final-stage voltage output based on the at least one first intermediate output voltage, and a final-stage offset voltage applied to the final-stage auxiliary differential input pair. The automatic calibrating op-amp system further comprises an automatic calibration circuit coupled to the final-stage voltage output of the instrumentation amplifier. The automatic calibration circuit comprises a single SAR controller configured to successively generate a plurality of bit signals in response to a calibration mode signal on a calibration mode input indicating a calibration mode, wherein a value of each successive plurality of bit signals is based on the final-stage output voltage at the final-stage voltage output. The automatic calibration circuit further comprises a DAC comprising a calibration output coupled to at least one of the at least one front-end auxiliary differential input pair comprising a first front-end auxiliary differential input pair and a second front-end auxiliary differential input pair, and the final-stage auxiliary differential input pair. The DAC is configured to convert each successive plurality of bit signals into a plurality of analog calibration signals on the calibration output based on the final-stage output voltage in response to the calibration mode signal indicating the calibration mode. The DAC is further configured to apply the plurality of analog calibration signals on the calibration output in response to the calibration mode signal indicating an amplify mode to compensate for a composite offset voltage of the instrumentation amplifier.

In another aspect, an automatic calibrating op-amp system is provided. The automatic calibrating op-amp system can comprise a means for generating at least one intermediate output voltage on at least one front-end voltage output based on a first input voltage and a second input voltage in an instrumentation amplifier, and at least one front-end offset voltage coupled to at least one front-end auxiliary differential input pair. The automatic calibrating op-amp system can also comprise a means for generating a final-stage output voltage on a final-stage voltage output based on the at least one intermediate output voltage, and at least one final-stage offset voltage coupled to at least one final-stage auxiliary differential input pair. The automatic calibrating op-amp system can also comprise a means for automatically calibrating comprising a calibration output coupled to at least one of the at least one front-end auxiliary differential input pair comprising a first front-end auxiliary differential input pair and a second front-end auxiliary differential input pair, and the at least one final-stage auxiliary differential input pair. The means for automatically calibrating can comprise a means for successively generating a plurality of bit signals in response to a calibration signal indicating a calibration mode, wherein a value of each successive plurality of bit signals is based on the final-stage output voltage at the final-stage voltage output. The means for automatically calibrating can comprise a means for converting each of the plurality of bit signals into an analog calibration signal comprising an offset voltage on the calibration output based on the final-stage output voltage, in response to the calibration mode signal indicating the calibration mode. The means for automatically calibrating can comprise a means for applying the analog calibration signal on the calibration output in response to the calibration signal indicating an amplify mode.

In another aspect, a method of automatically calibrating an offset voltage in an instrumentation amplifier is provided. The method comprises generating at least one intermediate output voltage on at least one front-end voltage output based on a first input voltage and a second input voltage, and at least one front-end offset voltage based on a calibration signal applied to at least one front-end auxiliary differential input pair. The method further comprises generating a final-stage output voltage on a final-stage voltage output based on the at least one intermediate output voltage, and a final-stage offset voltage based on the calibration signal applied to a final-stage auxiliary differential input pair. The method also comprises successively generating a plurality of bit signals in response to a calibration mode signal indicating a calibration mode, wherein a value of each successive plurality of bit signals is based on the final-stage output voltage at the final-stage voltage output. The method further comprises converting each successive plurality of bit signals into an analog calibration signal on a calibration output coupled to at least one of the at least one front-end auxiliary differential input pair comprising a first front-end auxiliary differential input pair and a second front-end auxiliary differential input pair, and the final-stage auxiliary differential input pair, based on the final-stage output voltage in response to the calibration mode signal indicating the calibration mode. The method also comprises applying the analog calibration signal on the calibration output in response to the calibration mode signal indicating an amplify mode.

DETAILED DESCRIPTION

Figure 1:
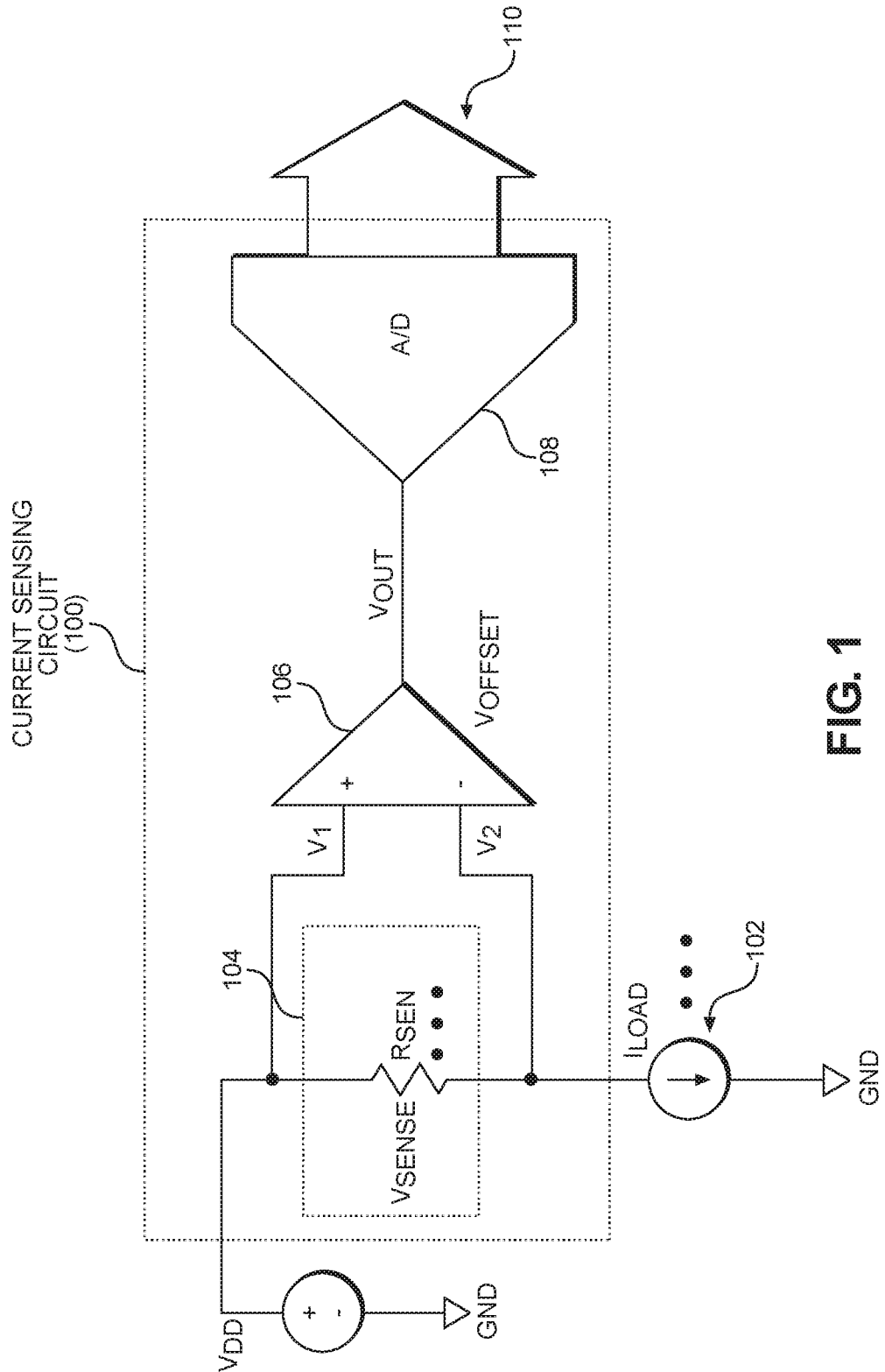
FIG. 1 is schematic diagram of a current sensing circuit employing a differential amplifier configured to sense a voltage proportional to a total current in one or more distributed load circuits to determine the total current in the distributed load circuits.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include single controller automatic calibrating circuits for reducing or canceling offset voltages in operational amplifiers (op-amps) in an instrumentation amplifier. For example, the instrumentation amplifier may be used to sense current distributed to a load circuit to measure power consumption. In this regard, in exemplary aspects disclosed herein, an automatic calibrating op-amp system is provided that includes an instrumentation amplifier. The instrumentation amplifier includes a front-end amplifier circuit comprising at least one front-end op-amp and a final-stage amplifier circuit comprising a final-stage op-amp. The front-end op-amp(s) and the final-stage amplifier circuit may have high input impedance, thus making the instrumentation amplifier particularly suited for use in making measurements, such as power consumption. The front-end op-amp(s) is configured to receive respective input voltages and generate intermediate output voltages according to the respective gain of the front-end op-amp(s). The final-stage op-amp is a differential amplifier that is configured to generate a final-stage output voltage representing a difference in the intermediate output voltages from the front-end op-amp(s). In one example, each of the op-amps in the instrumentation amplifier includes auxiliary differential inputs for offset voltage cancellation to reduce or eliminate sensing error. The automatic calibrating op-amp system also includes an automatic calibration circuit employing a single controller to generate calibration signals on a calibration output to an auxiliary differential input(s) of an op-amp(s) in the instrumentation amplifier for offset voltage cancellation. For example, the automatic calibration circuit may employ a successive approximation register (SAR) controller and digital-to-analog converter (DAC) for converting successive digital values from the SAR controller into the calibration signal. The automatic calibration circuit includes a single controller in examples disclosed herein to generate calibration signals to the instrumentation amplifier to cancel offset voltages to eliminate the need to provide multiple automatic calibration circuits or an automatic calibration circuit employing multiple controllers to cancel offset voltages in the instrumentation amplifier.

Figure 2:
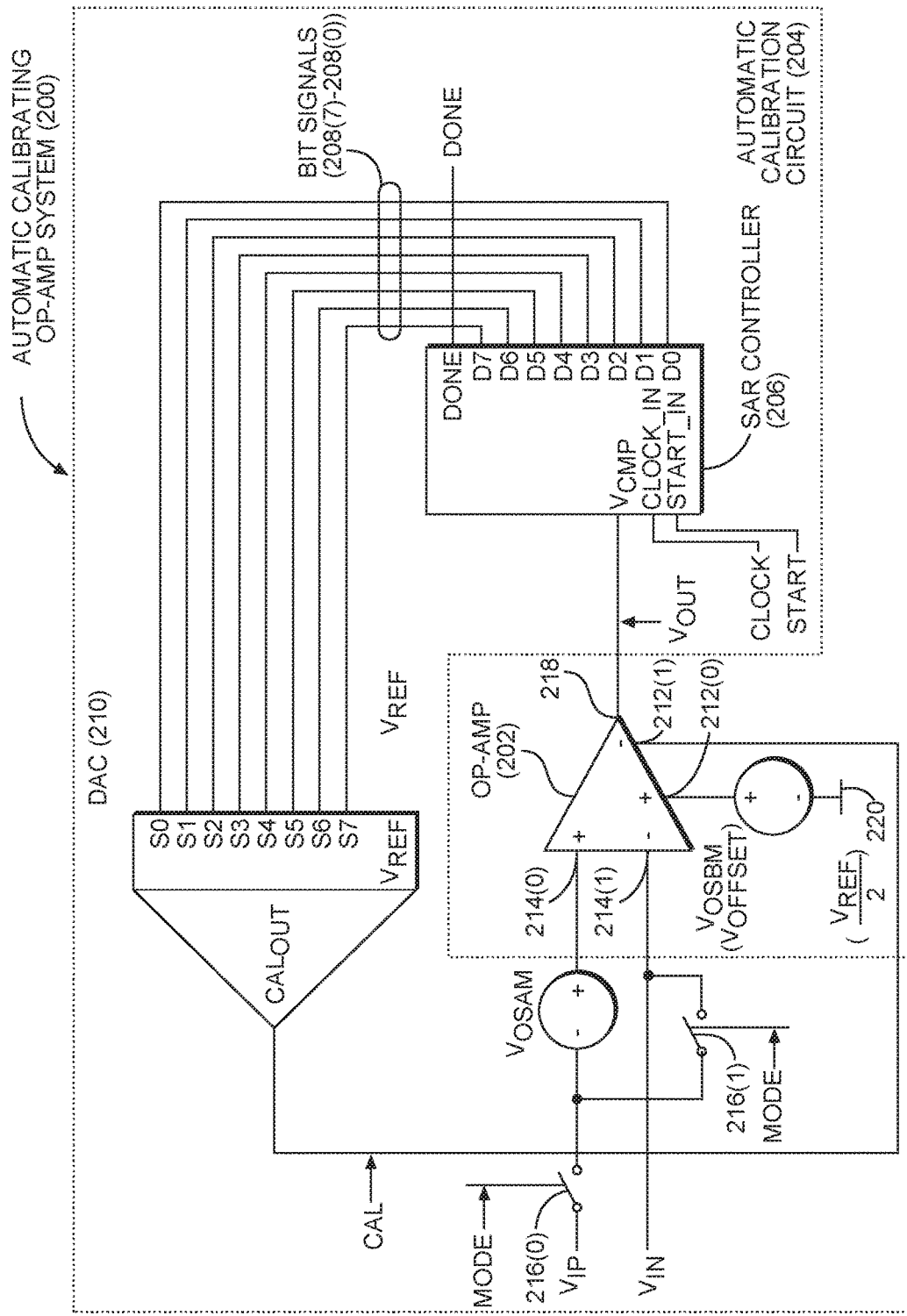
FIG. 2 is a diagram of an exemplary automatic calibrating operational amplifier (op-amp) system for mitigating effects of offset voltages.
Figure 3:
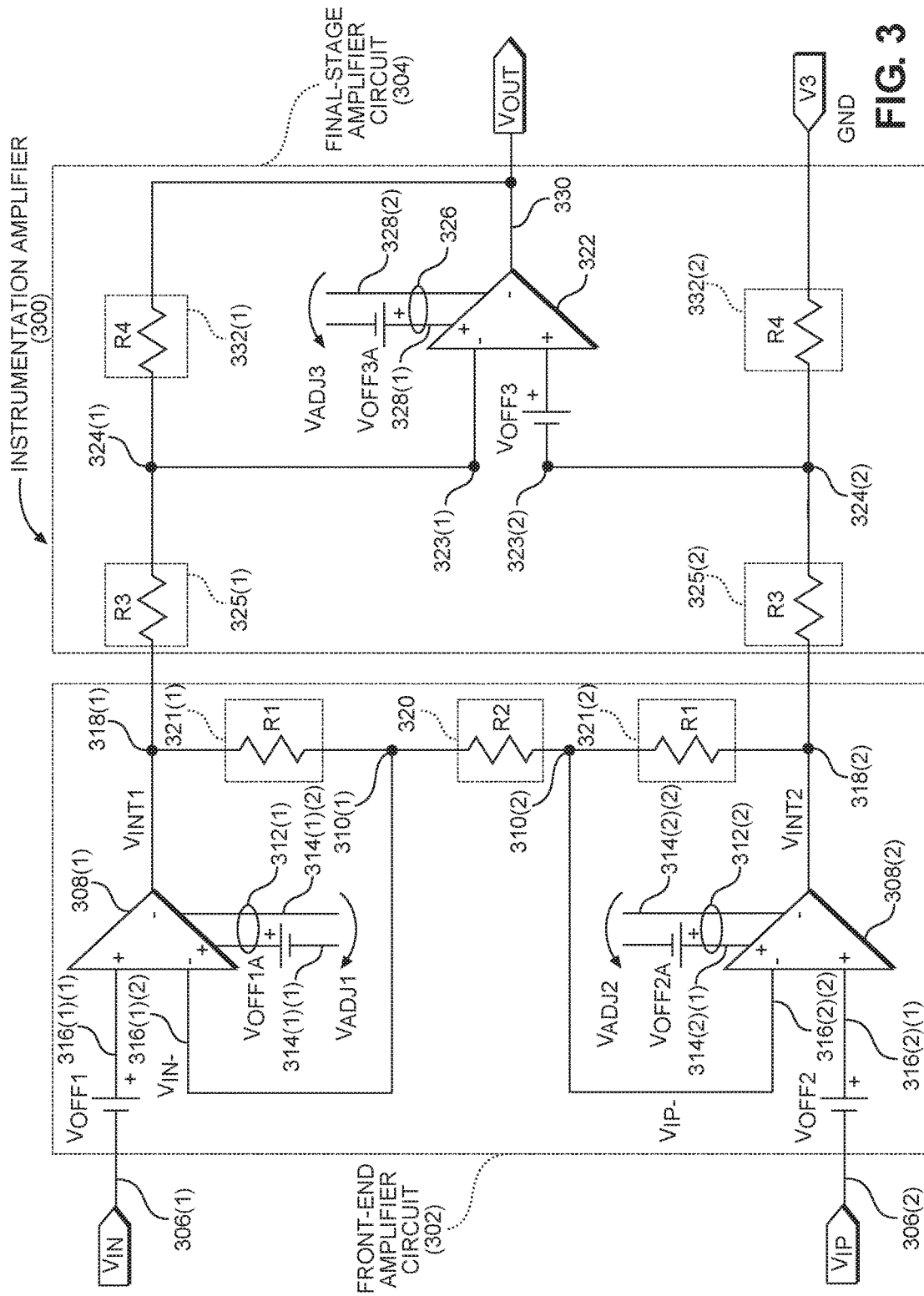
FIG. 3 is a schematic diagram of an instrumentation amplifier employing front-end and final-stage op-amps that include additional auxiliary differential inputs in the op-amps for offset voltage cancellation.
Figure 4:
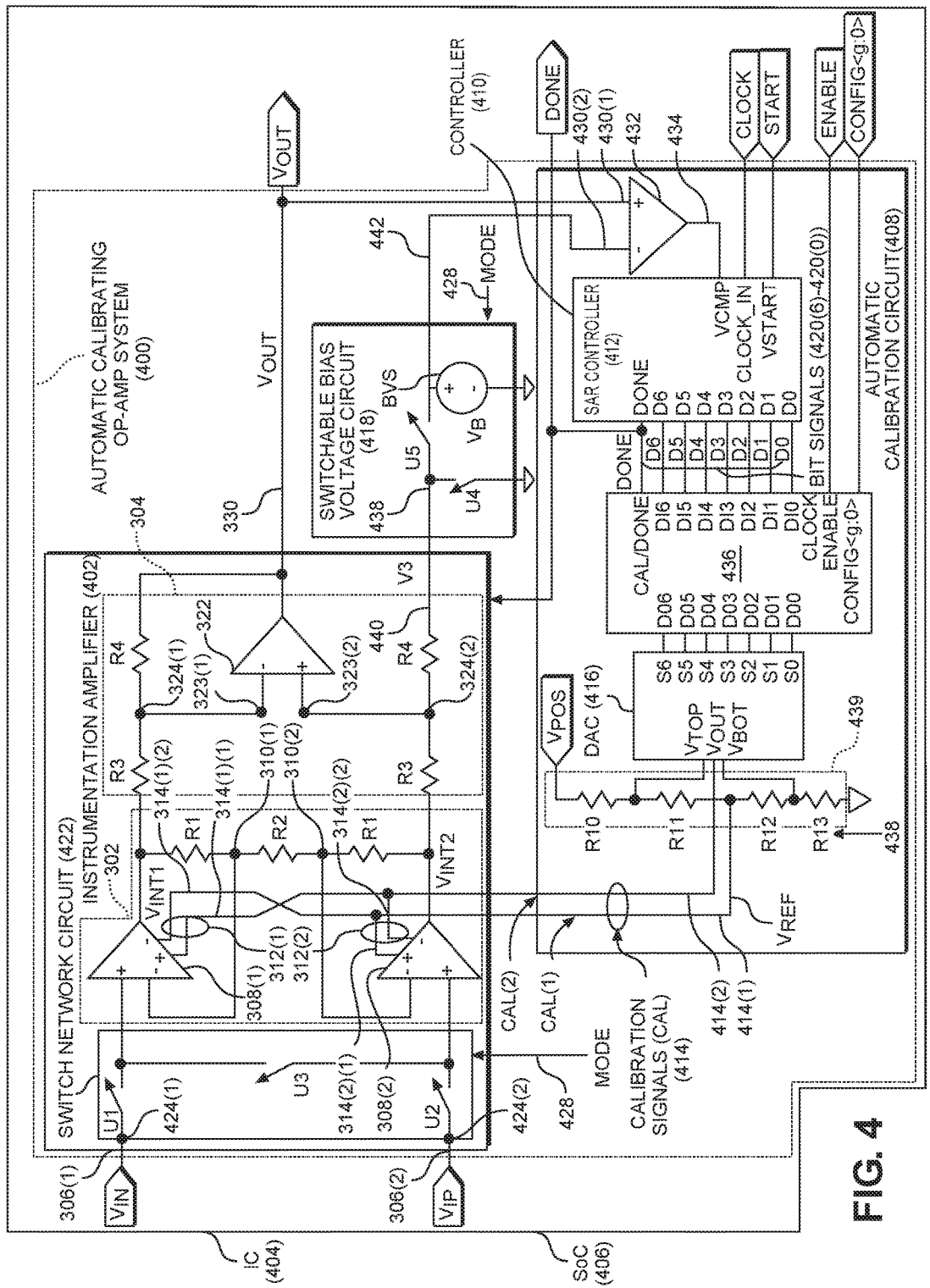
FIG. 4 is a schematic diagram of an automatic calibrating op-amp system that includes an instrumentation amplifier that includes additional auxiliary differential inputs in op-amps for offset voltage cancellation and an automatic calibration circuit employing a single controller configured to generate calibration signals to the auxiliary differential inputs of the front-end op-amps in the instrumentation amplifier to reduce or cancel offset voltage in the instrumentation amplifier.

Before discussing single controller automatic calibrating circuits for reducing or canceling offset voltages in op-amps in an instrumentation amplifier starting at FIG. 4, FIGS. 2 and 3 are first described. FIG. 2 is a diagram of an automatic calibrating op-amp system for mitigating effects of offset voltages wherein the system employs a single op-amp and calibration controller. FIG. 3 is a schematic diagram of an instrumentation amplifier employing front-end and final-stage op-amps that include additional auxiliary differential inputs in the op-amps for offset voltage cancellation, and that can be employed in the automatic calibrating op-amp system in FIG. 2.

In this regard, FIG. 2 illustrates an exemplary automatic calibrating op-amp system 200. The automatic calibrating op-amp system 200 is configured to compensate an op-amp output voltage signal $V_{OUT}$ generated by an op-amp 202 to mitigate effects of a composite offset voltage $V_{OFFSET}$ corresponding to the op-amp 202. As used herein, the composite offset voltage $V_{OFFSET}$ is a value used to reference effects of all offset voltages of the op-amp 202, wherein offset voltages are attributable to imperfections of the op-amp 202. In one aspect, the automatic calibrating op-amp system 200 employs an analog calibration signal CAL corresponding to a calibration mode to compensate the op-amp output voltage signal $V_{OUT}$ corresponding to an amplify mode. In this regard, an automatic calibration circuit 204 includes a SAR controller 206 configured to receive the op-amp output voltage signal $V_{OUT}$. The SAR controller 206 is also configured to successively generate bit signals 208 (7)-208(0) based on the op-amp output voltage signal $V_{OUT}$ in response to a mode signal MODE indicating the calibration mode.

With continuing reference to FIG. 2, the automatic calibration circuit 204 also includes a DAC 210 configured to convert each successive set of bit signals 208(7)-208(0) from the SAR controller 206 into the analog calibration signal CAL in response to the mode signal MODE indicating the calibration mode. The automatic calibration circuit 204 is configured such that, when the last set of the successive bit signals 208(7)-208(0) is converted, the analog calibration signal CAL has a voltage approximately equal to a composite offset voltage $V_{OFFSET}$ of the op-amp 202. The analog calibration signal CAL is provided to one of an auxiliary differential input pair 212 comprising a first auxiliary input 212(0) and a second auxiliary input 212(1) of the op-amp 202 such that the analog calibration signal CAL compensates for the composite offset voltage $V_{OFFSET}$ of the op-amp 202 in response to the mode signal MODE indicating the amplify mode. In this manner, because the analog calibration signal CAL is generated having a voltage approximately equal to the composite offset voltage $V_{OFFSET}$, compensating the op-amp 202 with the analog calibration signal CAL reduces or avoids the effects of the composite offset voltage $V_{OFFSET}$ on the op-amp output voltage signal $V_{OUT}$.

With continuing reference to FIG. 2, details of the automatic calibrating op-amp system 200 are now described. The automatic calibrating op-amp system 200 is configured such that the op-amp 202 generates the op-amp output voltage signal $V_{OUT}$. The op-amp output voltage signal $V_{OUT}$ is based on a voltage differential of a primary differential input pair 214 (also referred to herein as a first primary input 214(0) and a second primary input 214(1)) and a voltage differential of the auxiliary differential input pair 212 of the op-amp 202. In particular, first and second input voltages $V_{IP}$ and $V_{IN}$ may be provided to the first and second primary inputs 214(0), 214(1), respectively, while other voltages may be provided to the first and second auxiliary inputs 212(0), 212(1).

With continuing reference to FIG. 2, the automatic calibration circuit 204 is configured to electrically decouple the first and second primary inputs 214(0), 214(1) in response to the mode signal MODE indicating the amplify mode. In this manner, the automatic calibration circuit 204 includes a first switch 216(0) that is activated (i.e., closed) and a second switch 216(1) that is deactivated (i.e., opened) in response to the mode signal MODE indicating the amplify mode. In response to activation of the first switch 216(0) and deactivation of the second switch 216(1), the first input voltage $V_{IP}$ is provided to the first primary input 214(0), and the second voltage input $V_{IN}$ is provided to the second primary input 214(1). Additionally, the analog calibration signal CAL is provided to the second auxiliary input 212(1). In this manner, the op-amp 202 is configured to generate the op-amp output voltage signal $V_{OUT}$ on an output 218 equal to $A*(V_{IP}-V_{IN}+V_{OSAM}) B*(V_{OSBM}-CAL)$. In this equation, A is a gain associated with the first and second primary inputs 214(0), 214(1), and B is a gain associated with the first and second auxiliary inputs 212(0), 212(1). Further, $V_{OSAM}$ represents a primary offset voltage associated with the first and second primary inputs 214(0), 214(1), and $V_{OSBM}$ represents an auxiliary offset voltage associated with the first and second auxiliary inputs 212(0), 212(1).

With continuing reference to FIG. 2, the primary offset voltage $V_{OSAM}$ and the auxiliary offset voltage $V_{OSBM}$ are each illustrated as discrete voltage sources for purposes of the discussion herein. However, one of ordinary skill in the art will appreciate that the primary and auxiliary offset voltages $V_{OSAM}$, $V_{OSBM}$ are associated with the primary differential input pair 214 and the auxiliary differential input pair 212, respectively, rather than existing as discrete voltage sources. Further, as noted above, the composite offset voltage $V_{OFFSET}$ of the op-amp 202 is attributable to imperfections of the op-amp 202. One way to describe the composite offset voltage $V_{OFFSET}$ is with reference to the auxiliary differential input pair 212, wherein the composite offset voltage $V_{OFFSET}$ is equal to $A*V_{OSAM}/B+V_{OSBM}$. By describing the composite offset voltage $V_{OFFSET}$ with reference to the auxiliary differential input pair 212, the composite offset voltage $V_{OFFSET}$ can be illustrated in FIG. 2 as being present at a same location as the auxiliary offset voltage $V_{OSBM}$ corresponding to the first auxiliary input 212(0).

To mitigate the effects of the composite offset voltage $V_{OFFSET}$, the automatic calibration circuit 204 is also configured to operate in a calibration mode. In this regard, the first and second primary inputs 214(0), 214(1) are electrically coupled in response to the mode signal MODE indicating the calibration mode. For example, in this aspect, the first switch 216(0) is deactivated (i.e., opened) and the second switch 216(1) is activated (i.e., closed) in response to the mode signal MODE indicating the calibration mode. Thus, in the calibration mode, the primary offset voltage $V_{OSAM}$ is applied differentially between the first primary input 214(0) and the second primary input 214(1) due to deactivation of the first switch 216(0) and activation of the second switch 216(1). As a result, the op-amp 202 generates the op-amp output voltage signal $V_{OUT}$ representing a comparison of a voltage on the first auxiliary input 212(0) and a voltage on the second auxiliary input 212(1). Thus, if the composite offset voltage $V_{OFFSET}$ is greater than the analog calibration signal CAL on the second auxiliary input 212(1), the op-amp output voltage signal $V_{OUT}$ is equivalent to a logic high '1' state. Conversely, if the composite offset voltage $V_{OFFSET}$ is less than the analog calibration signal CAL on the second auxiliary input 212(1), the op-amp output voltage signal $V_{OUT}$ is equivalent to a logic low '0' state.

With continuing reference to FIG. 2, the op-amp output voltage signal $V_{OUT}$ is provided to a voltage compare input $V_{CMP}$ of the SAR controller 206 that is configured to receive the op-amp output voltage signal $V_{OUT}$. In response to a start signal START on a start input START_IN, the SAR controller 206 is configured to generate the bit signals 208(7)-

208(0) on bit signal outputs D7-D0 in response to the mode signal MODE indicating the calibration mode. The bit signal outputs D7-D0 are configured to provide the successive bit signals 208(7)-208(0) to the DAC 210. Additionally, the SAR controller 206 includes a clock input CLOCK_IN configured to receive a clock signal CLOCK, wherein the calibration mode has a duration of N+1 cycles of the clock signal CLOCK. In this example, N is equal to a number of bits of the SAR controller 206. The SAR controller 206 has eight (8) bits (e.g., bits 7-0) corresponding to the bit signals 208(7)-208(0). Thus, the calibration mode of the automatic calibrating op-amp system 200 has a duration of nine (9) clock cycles. As discussed below, the SAR controller 206 is configured to generate the bit signals 208(7)-208(0) during the first eight (8) cycles of the calibration mode, while a final cycle of the calibration mode is used to generate a done signal DONE. In other aspects, the number of bits "N" may be any whole number. A voltage source 220 having a voltage of one-half of a reference voltage $V_{REF}/2$ drives the first auxiliary input 212(0).

With continuing reference to FIG. 2, each of the bit signals 208(7)-208(0) corresponds to a cycle of the calibration mode. A bit signal 208(7)-208(0) corresponding to the current cycle of the calibration mode is set to a logic high '1' at the outset of the cycle. For example, during the first cycle of the calibration mode, the most significant bit of the bit signals 208(7)-208(0) (i.e., bit signal 208(7)) is set to a logic high '1' state, causing the bit signals 208(7)-208(0) to equal '1000000'. The bit signals 208(7)-208(0) are provided to bit signal inputs S7-S0 of the DAC 210. In response to receiving the bit signals 208(7)-208(0), the DAC 210 is configured to convert the bit signals 208(7)-208(0) into the analog calibration signal CAL. The DAC 210 includes a calibration output $CAL_{OUT}$ configured to provide the analog calibration signal CAL to the second auxiliary input 212(1).

As previously described, if the composite offset voltage $V_{OFFSET}$ associated with the first auxiliary input 212(0) is greater than the analog calibration signal CAL on the second auxiliary input 212(1), the op-amp output voltage signal $V_{OUT}$ is equivalent to a logic high '1' state. In response to the op-amp output voltage signal $V_{OUT}$ having a logic high '1' state, the corresponding bit signal 208(7)-208(0) remains at a logic high '1' state. Conversely, if the composite offset voltage $V_{OFFSET}$ associated with the first auxiliary input 212(0) is less than the analog calibration signal CAL on the second auxiliary input 212(1), the op-amp output voltage signal $V_{OUT}$ is equivalent to a logic low '0' state. In response to the op-amp output voltage signal $V_{OUT}$ having a logic low '0' state, the corresponding bit signal 208(7)-208(0) is set to a logic low '0' state. For example, if the op-amp output voltage signal $V_{OUT}$ has a logic high '1' state, the most significant bit signal 208(7) remains at a logic high '1' state. In other aspects, the comparison performed by the op-amp 202 can generate the op-amp output voltage signal $V_{OUT}$ in a metastable region. In such aspects, additional gain stages can be employed to drive the op-amp output voltage signal $V_{OUT}$ to a stable logic high '1' state or logic low '0' state. As a non-limiting example, additional gain stages can be employed in the SAR controller 206 such that the op-amp output voltage signal $V_{OUT}$ can trigger corresponding elements in the SAR controller 206.

Further, the op-amp output voltage signal $V_{OUT}$ is provided to the SAR controller 206 such that a next successive bit signal 208(7)-208(0) is generated based on the op-amp output voltage signal $V_{OUT}$ and provided to the DAC 210. For example, the next bit signal 208(7)-208(0) is set to a logic high '1' state (e.g., bit signal 208(6) is set to logic high '1,' wherein the bit signal 208(7)-208(0) is set to '11000000' if the comparison of the voltages provided on the first and second auxiliary inputs 212(0), 212(1) set the bit signal 208(6) to a logic high '1' state). The conversion and comparison functions described above are completed for the next cycle of the calibration mode. Thus, following the N+1 cycles of the calibration mode, the analog calibration signal CAL has a voltage that is approximately equal to the composite offset voltage $V_{OFFSET}$. In other words, the composite offset voltage $V_{OFFSET}$ equals $(A*V_{OSAM}/B+V_{OSBM})$. By comparing the analog calibration signal CAL to the composite offset voltage $V_{OFFSET}$ for each iteration of the SAR controller 206, the analog calibration signal CAL following the final cycle of the calibration mode is approximately equal to $(A*V_{OSAM}/B+V_{OSBM})$ (e.g., the composite offset voltage $V_{OFFSET}$).

In this manner, as previously described, the op-amp output voltage signal $V_{OUT}$ equals $(A*(V_{IP}-V_{IN}+V_{OSAM})B*(V_{OSBM}-CAL))$ in response to the mode signal MODE indicating the amplify mode. By substituting $(A*V_{OSAM}/B+V_{OSBM})$ for the analog calibration signal CAL in the previous equation, the equation reduces the op-amp output voltage signal $(V_{OUT}=A(V_{IP}-V_{IN}))$. Thus, in response to the mode signal MODE indicating the amplify mode, the analog calibration signal CAL provided to the second auxiliary input 212(1) compensates for the composite offset voltage $V_{OFFSET}$. In other words, effects of the composite offset voltage $V_{OFFSET}$ (i.e., all offset voltages of the op-amp 202) on the op-amp output voltage signal $V_{OUT}$ are mitigated. Therefore, the automatic calibrating op-amp system 200 reduces or avoids the effects of the composite offset voltage $V_{OFFSET}$ on the op-amp output voltage signal $V_{OUT}$ generated by the op-amp 202.

FIG. 3 is a schematic diagram of a three (3) op-amp instrumentation amplifier 300 (hereinafter "instrumentation amplifier 300") that facilitates offset cancellation. In this regard, the instrumentation amplifier 300 in FIG. 3 includes a front-end amplifier circuit 302 and a final-stage amplifier circuit 304. The front-end amplifier circuit 302 provides an input buffer between a first voltage input 306(1) configured to receive a first input voltage $V_{IN}$ and a second voltage input 306(2) configured to receive a second input voltage $V_{IP}$, and the final-stage amplifier circuit 304. Thus, the instrumentation amplifier 300 may be particularly suitable for use in acquiring measurements, such as to sense a supply current distributed to a load circuit. Additional characteristics of the instrumentation amplifier 300 include low direct current (DC) offset, low drift, low noise, high open-loop gain, high common-mode rejection ratios, and high input impedances. As will also be discussed below, amplifiers in the front-end amplifier circuit 302 and the final-stage amplifier circuit 304 including auxiliary differential input pairs to facilitate offset voltage cancellation.

With continuing reference to FIG. 3, the front-end amplifier circuit 302 includes a first front-end op-amp 308(1) and a second front-end op-amp 308(2). The first front-end op-amp 308(1) includes the first voltage input 306(1) on a non-inverting front-end voltage input 316(1)(1) configured to receive the first input voltage $V_{IN}$, and a front-end voltage input 316(1)(2) configured to receive a second front-end input voltage $V_{IN}-$ coupled to a first resistor circuit node 310(1). A fixed offset voltage $V_{OFF1}$ is shown coupled to the first voltage input 306(1). The first front-end op-amp 308(1) also includes a first front-end auxiliary differential input pair 312(1) comprising a first front-end auxiliary differential input 314(1)(1) and a second front-end auxiliary differential input 314(1)(2). An offset adjust voltage $V_{ADJ1}$ can be applied to the first front-end auxiliary differential input 314(1)(1) of the first front-end op-amp 308(1) to apply an offset voltage to the first front-end op-amp 308(1). A fixed offset voltage $V_{OFF1A}$ is shown coupled to the first front-end auxiliary differential input 314(1)(1). The first front-end op-amp 308(1) is configured to generate a first intermediate output voltage $V_{INT1}$ on the front-end voltage input 316(1)(2) based on the first input voltage $V_{IN}$, the second front-end input voltage $V_{IN}$–, and the offset voltages $V_{OFF1}$, $V_{OFF1A}$ and offset adjust voltage $V_{ADJ1}$. For example, the first front-end op-amp 308(1) may be a differential amplifier having gain 'A' with a feedback resistor circuit 321(1) that is resistor R1 in this example coupled between the first front-end voltage input 316(1)(2) and the first resistor circuit node 310(1).

With continuing reference to FIG. 3, the front-end amplifier circuit 302 also includes the second front-end op-amp 308(2). The second front-end op-amp 308(2) includes the second voltage input 306(2) on a non-inverting front-end voltage input 316(2)(1) configured to receive the second input voltage $V_{IP}$ and a front-end voltage input 316(2)(2) configured to receive a second front-end input voltage $V_{IP}$– coupled to a second resistor circuit node 310(2). A fixed offset voltage $V_{OFF2}$ is shown coupled to the second voltage input 306(2). The second front-end op-amp 308(2) also includes a second front-end auxiliary differential input pair 312(2) comprising a first front-end auxiliary differential input 314(2)(1) and a second front-end auxiliary differential input 314(2)(2). An offset adjust voltage $V_{ADJ2}$ can be applied to the second front-end auxiliary differential input 314(2)(2) of the second front-end op-amp 308(2) to apply an offset voltage to the second front-end op-amp 308(2). A fixed offset voltage $V_{OFF2A}$ is shown coupled to the second front-end auxiliary differential input 314(2)(2). The second front-end op-amp 308(2) is configured to generate a second intermediate output voltage $V_{INT2}$ on the front-end voltage input 316(2)(2) based on the second input voltage $V_{IN}$, the offset voltage $V_{OFF2}$, the second front-end input voltage $V_{IP}$–, the offset voltages $V_{OFF2}$, $V_{OFF2A}$, and the offset adjust voltage $V_{ADJ2}$. For example, the second front-end op-amp 308(2) may also be a differential amplifier with gain 'B' with a feedback resistor circuit 321(2) that is resistor R1 coupled between the first front-end voltage input 316(2)(2) and the second resistor circuit node 310(2). The resistors R1 have substantially the same resistance in this example. A gain resistor circuit 320 that includes resistor R2 is coupled between the first resistor circuit node 310(1) and the second resistor circuit node 310(2). The resistor R2 between the two inverting inputs of the front-end voltage inputs 316(2)(1), 316(2)(2) increases the differential-mode gain of the front-end amplifier circuit 302 while leaving the common-mode gain equal to one (1) in this example.

With continuing reference to FIG. 3, the front-end amplifier circuit 302 also includes the final-stage amplifier circuit 304 that includes a final-stage op-amp 322. The final-stage op-amp 322 includes a first final-stage voltage input 323(1) on a non-inverting node coupled to a first resistor circuit node 324(1), and a second final-stage voltage input 323(2) on an inverting node coupled to a second resistor circuit node 324(2). Resistor circuits 325(1), 325(2) that include resistors R3 are each coupled between respective first resistor circuit nodes 318(1), 324(1) and second resistor circuit nodes 318(2), 324(2). The resistors R3 have substantially the same resistance in this example. A fixed offset voltage $V_{OFF3}$ is shown coupled to the second final-stage voltage input 323(2). The final-stage op-amp 322 also includes a final-stage auxiliary differential input pair 326 comprising a first final-stage auxiliary differential input 328(1) and a second final-stage auxiliary differential input 328(2). An offset adjust voltage $V_{ADJ3}$ can be applied to the final-stage auxiliary differential input 328(2) of the final-stage op-amp 322 to apply an offset voltage to the final-stage op-amp 322. A fixed offset voltage $V_{OFF3A}$ is shown coupled to the first final-stage auxiliary differential input 328(1). The final-stage op-amp 322 is configured to generate a final-stage output voltage $V_{OUT}$ on a first final-stage voltage output 330 based on the first intermediate output voltage $V_{INT1}$, the second intermediate output voltage $V_{INT2}$, the offset voltages $V_{OFF3}$, $V_{OFF3A}$, and the offset adjust voltage $V_{ADJ3}$. For example, the first front-end op-amp 308(1) may be a differential amplifier with a gain 'A' with a feedback resistor R1 coupled between the first front-end voltage input 316(1)(2) and the first resistor circuit node 310(1). First and second resistor circuits 332(1), 332(2) each comprising resistors R4 are coupled between the final-stage voltage output 330 and the first and second resistor circuit nodes 324(1), 324(2). The resistors R4 have substantially the same resistance in this example. An input V3 coupled to the second resistor circuit 332(2) may be connected to ground GND.

Thus, the differential gain defined by the final-stage output voltage $V_{OUT}$ of the instrumentation amplifier 300 in FIG. 3 is given by the equation (1) below, wherein the offset voltages $V_{OFF1}$, $V_{OFF1A}$, $V_{ADJ1}$, $V_{OFF2}$, $V_{OFF2A}$, $V_{ADJ2}$, $V_{OFF3}$, $V_{OFF3A}$, $V_{ADJ3}$, and a voltage in the input V3 are all zero (0).

$$VOUT = \frac{(2R1 + R2)}{R2} \frac{R4}{R3}(Vip - Vin) \qquad (1)$$

If a differential voltage between the first and second voltage inputs $V_{IN}$, $V_{IP}$ was zero (0) in the instrumentation amplifier 300 in FIG. 3, the final-stage output voltage $V_{OUT}$ is given by the equation (2) below affected only by the offset voltages $V_{OFF1}$, $V_{OFF1A}$, $V_{ADJ1}$, $V_{OFF2}$, $V_{OFF2A}$, $V_{ADJ2}$, $V_{OFF3}$, $V_{OFF3A}$, $V_{ADJ3}$, and voltage V3.

$$Vout = \frac{(2R1 + R2)}{R2} \frac{R4}{R3}\left[(Voff2 - Voff1) + \frac{B}{A}(Voff2a - Voff1a) + \frac{B}{A}(Vadj2 - Vadj1)\right] + V3 + \left(1 + \frac{R4}{R3}\right)\left[Voff3 + \frac{B}{A}(Voff3a + Vadj3)\right] \qquad (2)$$

An automatic calibration circuit, like the automatic calibration circuit 204 in FIG. 2, can be provided for each of the first and second front-end op-amps 308(1), 308(2) and the final-stage op-amp 322 to calibrate each of the offset adjust voltages $V_{ADJ1}$, $V_{ADJ2}$, and $V_{ADJ3}$ to cancel or reduce the offset voltage of the instrumentation amplifier 300. However, this would require three (3) separate automatic calibration circuits and associated controllers. It may be desired to find a way to cancel or reduce the offset voltage of the instrumentation amplifier 300 without requiring an automatic calibration circuit and associated controller for each of the first and second front-end op-amps 308(1), 308(2) and the final-stage op-amp 322.

Figure 4A:
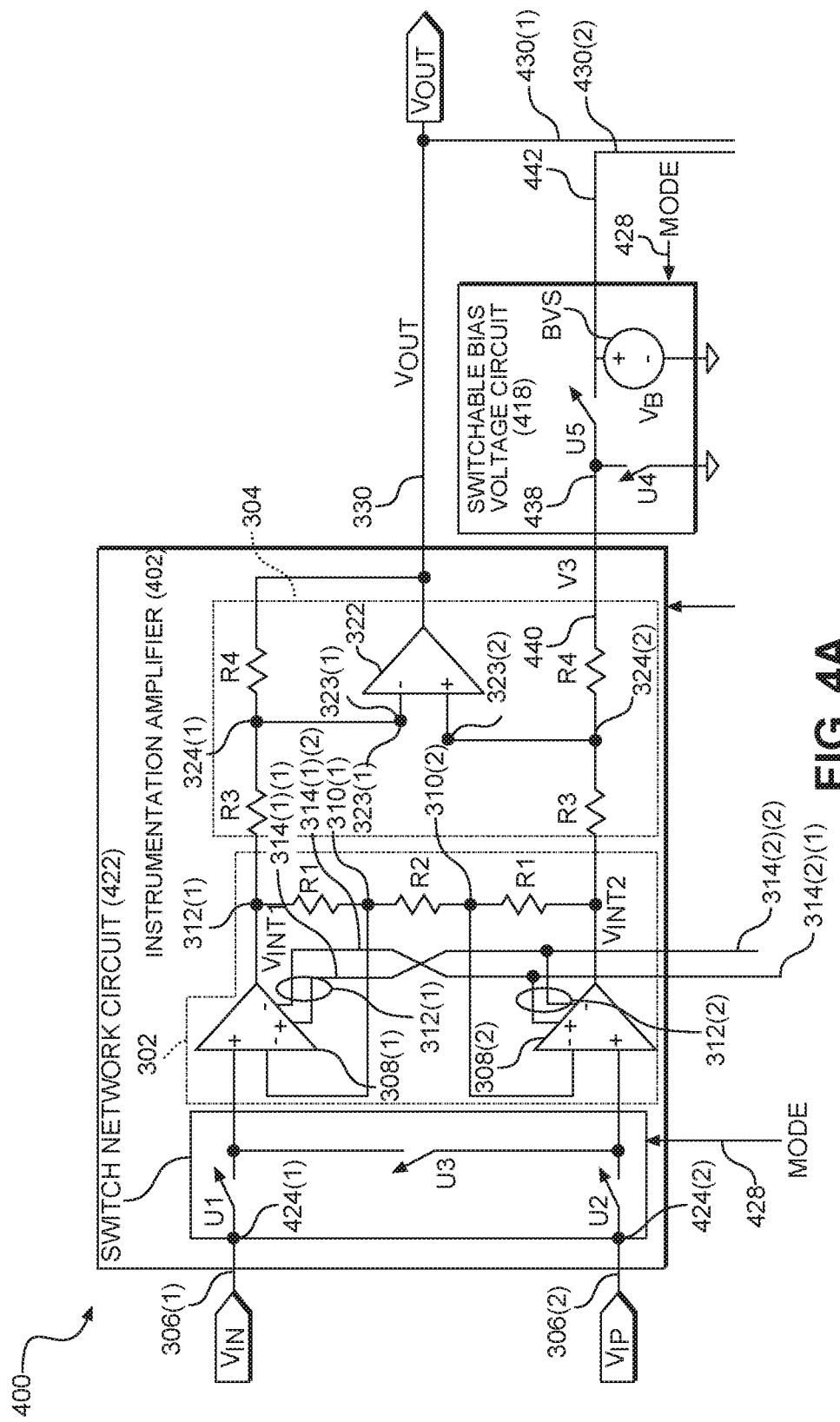
FIG. 4A is a schematic diagram illustrating the instrumentation amplifier and an optional switchable bias voltage circuit in the automatic calibrating op-amp system in FIG. 4.
Figure 4B:
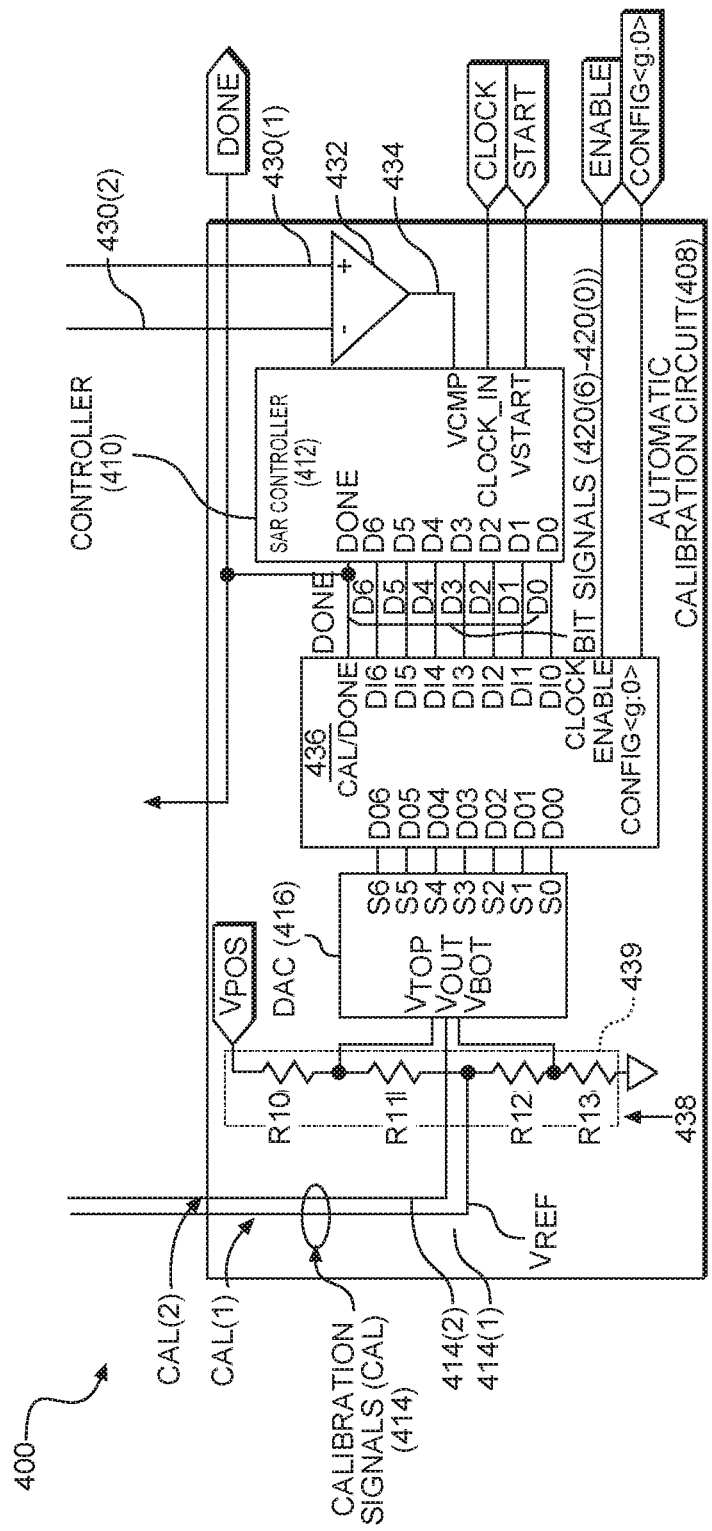
FIG. 4B is a schematic diagram illustrating single controller, automatic calibration circuit in the automatic calibrating op-amp system in FIG. 4.

In this regard, FIG. 4 is a schematic diagram of an automatic calibrating op-amp system 400 that includes an instrumentation amplifier 402 similar to the instrumentation amplifier 300 in FIG. 3. The instrumentation amplifier 402 is provided as an IC 404, which may be a system-on-a-chip (SoC) 406 for example. Common elements between the instrumentation amplifier 402 in FIG. 4 and the instrumentation amplifier 300 in FIG. 3 are shown with common element numbers. The first and second front-end op-amps 308(1), 308(2) in the instrumentation amplifier 402 include the respective additional first and second front-end auxiliary differential input pairs 312(1), 312(2) for offset voltage cancellation. As will be described in more detail below, the automatic calibrating op-amp system 400 also includes an automatic calibration circuit 408 employing a single controller 410 in the form of a SAR controller 412 in this example. As will be described in more detail below, the automatic calibration circuit 408 is configured to generate analog calibration signals CAL(1), CAL(2) on calibration inputs 414(1), 414(2) from a DAC 416 on the first and second front-end auxiliary differential input pairs 312(1), 312(2) to reduce or cancel offset voltage in the instrumentation amplifier 402. FIG. 4A is a schematic diagram illustrating the instrumentation amplifier 402 with an optional switchable bias voltage circuit 418 in the automatic calibrating op-amp system 400 in FIG. 4 in more detail. FIG. 4B is a schematic diagram illustrating the automatic calibration circuit 408 in the automatic calibrating op-amp system 400 in FIG. 4 in more detail.

With reference to FIG. 4, the final-stage op-amp 322 in the final-stage amplifier circuit 304 does not show the final-stage auxiliary differential input pair 326 like in the instrumentation amplifier 300 in FIG. 3, but only for discussion purposes with regard to equation (3) below that shows the final-stage output voltage $V_{OUT}$ of the instrumentation amplifier 402. Note however that in operation, the final-stage op-amp 322 will have a differential input pair having a differential voltage. Equation (3) below shows the final-stage output voltage $V_{OUT}$ of the instrumentation amplifier 402 assuming that the offset voltages $V_{OFF3}$, $V_{OFF3A}$, and offset adjust voltage $V_{ADJ3}$ are zero (0). An observation can be made in equation (3) that if the offset voltages $V_{OFF1}$, $V_{OFF2}$ were equal and of the same polarity, then their effect on the final-stage output voltage $V_{OUT}$ would common-mode out (i.e., $V_{OFF2}-V_{OFF1}=0$ for a positive polarity, or $-V_{OFF2}--V_{OFF1}=0$ for a negative polarity). The same holds true between the offset voltages $V_{OFF1A}$, $V_{OFF2A}$. For maximum effect on the final-stage output voltage $V_{OUT}$, the offset adjust voltages $V_{ADJ1}$, $V_{ADJ2}$ will have opposite polarities; otherwise, if they were equal, they would have no effect on the final-stage output voltage $V_{OUT}$.

$$Vout = \frac{(2R1+R2)}{R2} \qquad (3)$$
$$\frac{R4}{R3}\left[(Voff2-Voff1) + \frac{B}{A}(Voff2a - Voff1a) + \frac{B}{A}(Vadj2-Vadj1)\right]$$

In this regard, as illustrated in FIG. 4, the first front-end auxiliary differential inputs 314(1)(1), 314(1)(2) of the first front-end op-amp 308(1) are coupled to the respective calibration inputs 414(1), 414(2) of the automatic calibration circuit 408 such that the analog calibration signals CAL(1), CAL(2) are applied to the respective first front-end auxiliary differential inputs 314(1)(1), 314(1)(2). But to reverse the polarity of the analog calibration signals CAL(1), CAL(2) applied to the second front-end auxiliary differential inputs 314(2)(1), 314(2)(2) of the second front-end op-amp 308(2) to maximize their effect on the final-stage output voltage $V_{OUT}$ and not common-mode out the instrumentation amplifier 402, the second front-end auxiliary differential inputs 314(2)(1), 314(2)(2) are connected to the respective calibration inputs 414(2), 414(1) in reverse of the calibration inputs 414(1), 414(2) coupled to the respective first front-end auxiliary differential inputs 314(1)(1), 314(1)(2). The reversal of the connections of the calibration inputs 414(2), 414(1) to the first and second front-end auxiliary differential inputs 314(1)(1), 314(1)(2) and 314(2)(1), 314(2)(2) realizes the effect of the offset adjust voltage $V_{ADJ2}$ being equal to the negative (i.e., reverse polarity) of the offset adjust voltage $V_{ADJ2}$. In this example, this allows the one automatic calibration circuit 408 with its single controller 410 to be used to cancel the offset voltage of the instrumentation amplifier 402 for greater sense accuracy.

With continuing reference to FIGS. 4 and 4B, the automatic calibration circuit 408 also includes the DAC 416 configured to convert each successive set of bit signals 420(6)-420(0) from the 7-bit SAR controller 412 in this example into the analog calibration signals CAL(1), CAL(2) on the calibration inputs 414(1), 414(2) in response to a calibration mode signal MODE indicating a calibration mode. In a calibration mode, the first voltage input 306(1) and the second voltage input 306(2) are coupled to each other in a common mode such that the final-stage output voltage $V_{OUT}$ of the instrumentation amplifier 402 will be as shown in equation (2) above. Thus, in this example, the instrumentation amplifier 402 includes a switch network circuit 422 that is configured to couple the first voltage input 306(1) to the second voltage input 306(2) in response to the calibration mode signal MODE indicating a calibration mode, and is configured to decouple the first voltage input 306(1) to the second voltage input 306(2) in response to the calibration mode signal MODE indicating an amplify mode. In this regard, in the calibration mode, the offset voltage of the instrumentation amplifier 402 on the final-stage voltage output 330 is provided to the automatic calibration circuit 408 to seek the value of the analog calibration signals CAL(1), CAL(2) coupled to the first and second front-end auxiliary differential inputs 314(1)(1), 314(1)(2) and 314(2)(1), 314(2)(2) through the calibration inputs 414(1), 414(2) to cause the voltage at the final-stage voltage output 330 to be substantially zero (0), meaning that the offset voltage of the instrumentation amplifier 402 is canceled.

In this regard, with continuing reference to FIGS. 4 and 4A, the switch network circuit 422 is coupled to the first voltage input 306(1) and the second voltage input 306(2). The switch network circuit 422 includes a first switch voltage input 424(1) configured to receive the first input voltage $V_{IN}$ from the first voltage input 306(1). The switch network circuit 422 also includes a second switch voltage input 424(2) configured to receive the second input voltage $V_{IP}$ from the second voltage input 306(2). The switch network circuit 422 also includes a first switch circuit U1 coupled between the first switch voltage input 424(1) and the first front-end voltage input 316(1)(1) of the first front-end op-amp 308(1). The switch network circuit 422 also includes a second switch circuit U2 coupled between the second switch voltage input 424(2) and the first front-end voltage input 316(1)(2) of the first front-end op-amp 308(1). The switch network circuit 422 also includes a calibration switch circuit U3 coupled between the first and second switch circuits U1, U2.

In response to the calibration mode signal MODE on a calibration mode input 428 indicating a calibration mode, the switch network circuit 422 is configured to open either the first switch circuit U1 or the second switch circuit U2, while opening the other second switch circuit U2 or the other first switch circuit U1 to decouple either the first voltage input 306(1) from the front-end voltage input 316(1)(1) of the first front-end op-amp 308(1), or decouple the second voltage input 306(2) from the front-end voltage input 316(2)(1) of the second front-end op-amp 308(2). The switch network circuit 422 is configured to close the calibration switch circuit U3 to short-circuit the first front-end voltage input 316(1)(1) of the first front-end op-amp 308(1) to the second front-end voltage input 316(2)(1) of the second front-end op-amp 308(2) to put the instrumentation amplifier 402 in a common mode. As discussed below, the automatic calibration circuit 408 then seeks the value of the analog calibration signals CAL(1), CAL(2) coupled to the first and second front-end auxiliary differential inputs 314(1)(1), 314(1)(2) and 314(2)(1), 314(2)(2) through the calibration inputs 414(1), 414(2) to cause the voltage at the final-stage voltage output 330 to be substantially equal to the bias voltage supply BVS (discussed below), meaning that the offset voltage of the instrumentation amplifier 402 is canceled.

In response to the calibration mode signal MODE on the calibration mode input 428 indicating an amplify mode, the switch network circuit 422 is configured to open the calibration switch circuit U3 to decouple the first front-end voltage input 316(1)(1) of the first front-end op-amp 308(1) from the second front-end voltage input 316(2)(1) of the second front-end op-amp 308(2) to put the instrumentation amplifier 402 in an amplify mode. The switch network circuit 422 is configured to close the first switch circuit U1 and the second switch circuit U2 to couple the first voltage input 306(1) from the front-end voltage input 316(1)(1) of the first front-end op-amp 308(1), and couple the second voltage input 306(2) from the front-end voltage input 316(2)(1) of the second front-end op-amp 308(2).

With reference to FIGS. 4 and 4B, the automatic calibration circuit 408 is now described. The automatic calibration circuit 408 is configured such that when the last set of the successive bit signals 420(6)-402(0) is converted by the SAR controller 412, the analog calibration signals CAL(1), CAL(2) have a voltage difference that forces the final-stage output voltage $V_{OUT}$ to be substantially zero (0) voltage with voltage V3 equal to zero (0) as shown in equation (2) above. The analog calibration signals CAL(1), CAL(2) are analog signals that are provided to the auxiliary differential inputs 314(1)(1), 314(1)(2) and 314(2)(1), 314(2)(1) as previously discussed above to compensate for the composite offset voltage of the instrumentation amplifier 402 in response to the calibration mode signal MODE indicating the amplify mode.

With continuing reference to FIGS. 4 and 4B, the final-stage output voltage signal $V_{OUT}$ is provided to a first voltage input 430(1) of a calibration op-amp 432. A second voltage input 430(2) of the calibration op-amp 432 is coupled to the switchable bias voltage circuit 418 that will be described below. A voltage output node 434 of the calibration op-amp 432 is coupled to the single SAR controller 412. In response to a start signal START on a start input VSTART, the SAR controller 412 is configured to generate the bit signals 420(6)-420(0) on bit signal outputs D6-D0 in response to the calibration mode signal MODE indicating the calibration mode. The bit signal outputs D6-D0 are configured to provide the successive bit signals 420(6)-420(0) to an optional noise averaging circuit 436 in this example. The noise averaging circuit 436 is configured to average the successive bit signals 420(6)-420(0) to have the effect of canceling noise. The noise averaging circuit 436 is configured to generate bit signals D06-D00 to the DAC 416. Additionally, the SAR controller 412 includes a clock input CLOCK_IN configured to receive a clock signal CLOCK, wherein the calibration mode has a duration of N+1 cycles of the clock signal CLOCK. In this example, N is equal to the number of bits of the SAR controller 412. The SAR controller 412 has seven (7) bits (e.g., bits 6-0) corresponding to the bit signals 420(6)-420(0). Thus, the calibration mode of the automatic calibrating op-amp system 400 has a duration of eight (8) clock cycles. As discussed below, the SAR controller 412 is configured to generate the bit signals 420(6)-420(0) during the first seven (7) cycles of the calibration mode, while a final cycle of the calibration mode is used to generate a done signal DONE. In other aspects, the number of bits "N" may be any whole number.

Another possible function of the done signal DONE could be the modification of the internal frequency compensation components of the individual op-amps 308(1), 308(2), 322 to make them faster, possibly at the expense of phase margin. This might be necessary if the auxiliary differential inputs 314(1)(1), 314(1)(2) and 314(2)(1), 314(2)(1) of the op-amps 308(1), 308(2), 322 significantly reduce frequency noise. In that case, the offset calibration cycle may be controlled to not be completed as rapidly as possible. The automatic calibration circuit 408 may not be completely disconnected from the instrumentation amplifier 402 since the op-amps 308(1), 308(2), 322 must still function with their negative feedback networks, but it may be possible to modify them to make the op-amps 308(1), 308(2), 322 faster.

With continuing reference to FIGS. 4 and 4B, each of the bit signals 420(6)-420(0) corresponds to a cycle of the calibration mode. The bit signals 420(6)-420(0) corresponding to the current cycle of the calibration mode are set to a logic high '1' at the outset of the cycle. For example, during the first cycle of the calibration mode, the most significant bit of the bit signals 420(6)-420(0) (i.e., bit signal 420(6)) is set to a logic high '1' state, causing the bit signals 420(6)-420(0) to equal '100000'. The bit signals 420(6)-420(0) are provided to bit signal inputs S7-S0 of the DAC 416. In response to receiving the bit signals 420(6)-420(0), the DAC 416 is configured to convert the bit signals 420(6)-420(0) into the analog calibration signals CAL(1), CAL(2) on the calibration inputs 414(1), 414(2).

Further, the final-stage output voltage $V_{OUT}$ is provided to the SAR controller 412 such that a next successive bit signal 420(6)-420(0) is generated based on the op-amp output voltage signal ($V_{OUT}$) and provided to the DAC 416. For example, the next bit signal 420(6)-420(0) is set to a logic high '1' state (e.g., bit signal 420(6) is set to logic high '1,' wherein the bit signal 420(6)-420(0) is set to '11000000' if the comparison of the voltages provided on the first and second auxiliary differential input pairs 312(1), 312(2) set the bit signal 420(6) to a logic high '1' state). The conversion and comparison functions described above are completed for the next cycle of the calibration mode.

Further, a voltage divider 439 is employed in the automatic calibration circuit 408 that is driven by a positive voltage $V_{POS}$ and includes resistors R10, R11, R12, and R13. The voltage divider 439 is configured to receive a top reference voltage $V_{POS}$ and generate a reference voltage $V_{REF}$, which is a weighted average of the top reference voltage $V_{POS}$ and a bottom reference ground voltage. The reference voltage $V_{REF}$ is the analog calibration signal CAL(1) and drives the first and second front-end auxiliary differential input pairs 312(1), 312(2) of the first and second front-end op-amps 308(1), 308(2). In this manner, the voltage differential of the analog calibration signals CAL(1), CAL(2) may compensate for the composite offset voltage of the instrumentation amplifier 402 between a range of positive and negative voltages.

In this example, the automatic calibration circuit 408 is able to achieve overall offset voltage levels in the instrumentation amplifier 402 on the order of 40 uV or less as an example, even in the presence of significant frequency noise. The automatic calibration circuit 408 could include a control circuit to control its operation during a calibration mode. Calibration may be performed at power up, and/or it may be performed periodically. Note that when the instrumentation amplifier 402 is set into a calibration mode by control of the switch network circuit 422, it must be taken off-line and out-of-service. Provisions for this behavior must be made in the application circuit.

With continuing reference to FIGS. 4 and 4A, the automatic calibrating op-amp system 400 also includes the switchable bias voltage circuit 418. Referring to equation (2) above and noting that if offset voltage $V_{OFF3A}$ and offset adjust voltage $V_{ADJ3}$ are essentially zero, and stipulating that offset adjust voltages $V_{ADJ2}=V_{ADJ1}$, then the value of offset adjust voltage $V_{ADJ1}$ that makes the final-stage output voltage $V_{OUT}$ equal to zero when voltage V3 is zero will also make the final-stage output voltage $V_{OUT}$ equal to voltage V3 when voltage V3 is not zero. This allows for convenient operation of the automatic calibration circuit 408 when the instrumentation amplifier 402 must operate from a single power supply voltage.

In this regard, as shown in FIGS. 4 and 4A, the switchable bias voltage circuit 418 is provided and includes a bias voltage input 438 coupled to a node 440 of the instrumentation amplifier 402 having voltage V3. The switchable bias voltage circuit 418 also includes a bias voltage output 442 coupled to a bias voltage supply BVS and the second voltage input 430(2) of the calibration op-amp 432 of the automatic calibration circuit 408. The switchable bias voltage circuit 418 also includes a ground switch U4 coupled to the bias voltage input 438 and a ground node GND, and coupled to the calibration mode input 428. The switchable bias voltage circuit 418 also includes a bias switch U5 coupled to the bias voltage input 438 and the bias voltage output 442. In response to the calibration mode signal MODE on the calibration mode input 428 indicating a calibration mode, the ground switch U4 is deactivated and the bias switch U5 is activated to couple a bias voltage $V_B$ from the bias voltage supply BVS to the second voltage input 430(2) of the calibration op-amp 432 to apply the bias voltage $V_B$ to the second voltage input 430(2). For example, the bias voltage $V_B$ may be 0.5 V. In response to the calibration mode signal MODE on the calibration mode input 428 indicating an amplify mode, the ground switch U4 is activated to couple the ground node GND to the bias voltage input 438, and the bias switch U5 is deactivated. This applies a zero voltage V3 to the second voltage input 430(2) of the calibration op-amp 432 in the amplify mode.

In this manner, the range of output voltages for the DAC 416 in the automatic calibration circuit 408 for compensating the full range of values of the offset voltages of the instrumentation amplifier 402 can take on can be calculated. This allows for no dynamic range in the DAC 416 outputs to be wasted. The full range of the DAC 416 can cover the full range of expected offset voltages. For FIG. 4, the offset voltage $V_{OFF3A}$ is zero (0). The contribution of offset voltage $V_{OFF3}$ to the range needed for offset adjust voltage $V_{ADJ1}$ depends on the first stage gain of the front-end amplifier circuit 302: (2R1+R2)/R2. The larger this gain, the less effect the offset voltage $V_{OFF3}$ has on the offset adjust voltage $V_{ADJ1}$.

Figure 5:
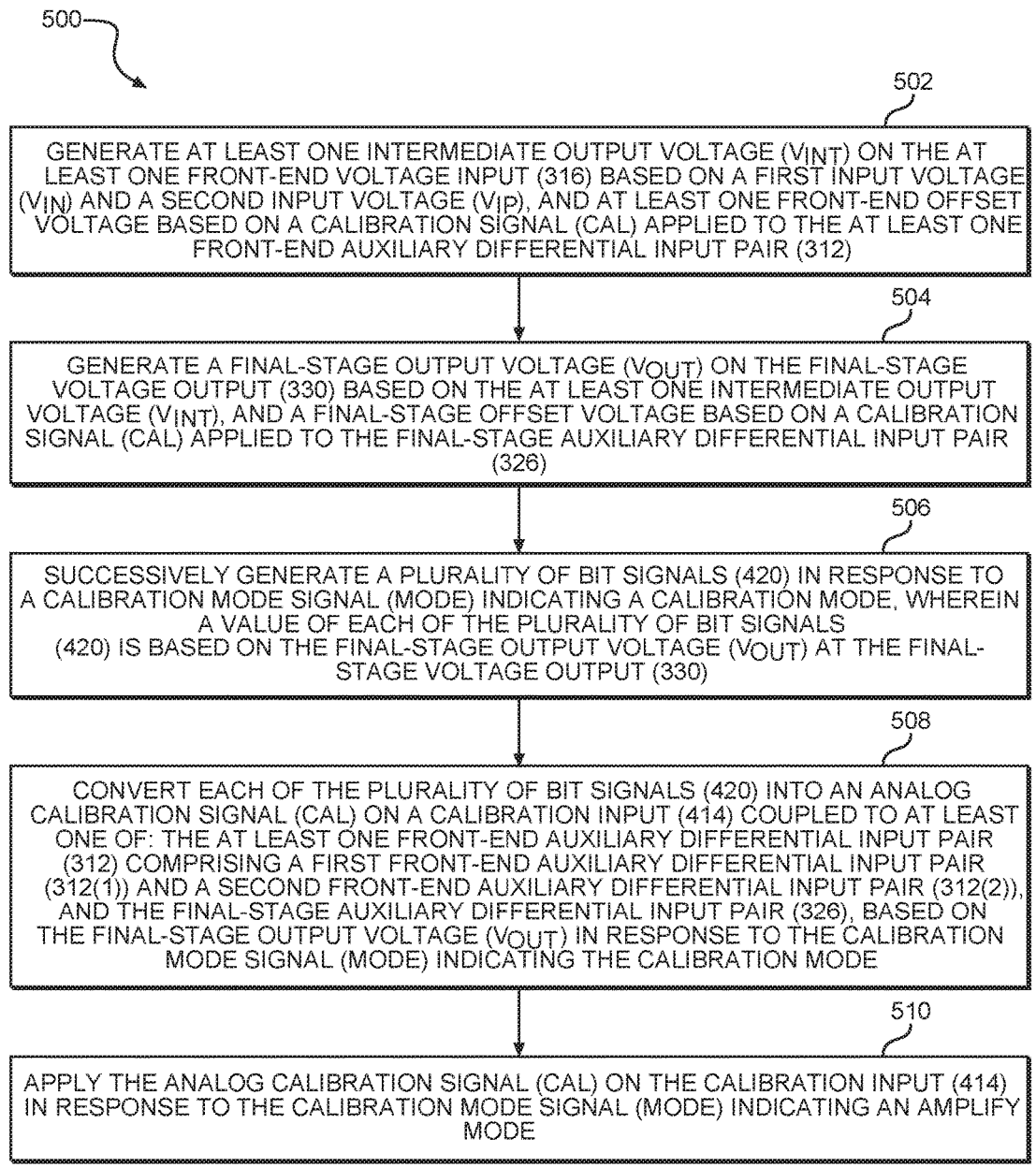
FIG. 5 is a flowchart illustrating an exemplary process of the automatic calibration circuit in the automatic calibrating op-amp system in FIG. 4 calibrating calibration signals input into auxiliary differential inputs of op-amps in the instrumentation amplifier to reduce or cancel offset voltage in the instrumentation amplifier.

FIG. 5 is a flowchart illustrating an exemplary process 500 of the automatic calibration circuit 408 in the automatic calibrating op-amp system 400 in FIG. 4 generating analog calibration signals CAL input into auxiliary differential input pairs of the first and second front-end op-amps 308(1), 308(2) and/or the final-stage op-amp 322 in the instrumentation amplifier 402 to reduce or cancel offset voltage in the instrumentation amplifier 402. In this regard, the process 500 includes the instrumentation amplifier 402 generating at least one intermediate output voltage $V_{INT}$ on the at least one front-end voltage input 316 based on a first input voltage $V_{IN}$ and a second input voltage $V_{IP}$, and at least one front-end offset voltage based on an analog calibration signal CAL applied to the at least one front-end auxiliary differential input pair 312 (block 502). The process 500 also involves the instrumentation amplifier 402 generating a final-stage output voltage $V_{OUT}$ on the final-stage voltage output 330 based on the at least one intermediate output voltage $V_{INT}$, and a final-stage offset voltage based on an analog calibration signal CAL applied to the final-stage auxiliary differential input pair 326 (block 504). The process 500 also includes the automatic calibration circuit 408 successively generating a plurality of bit signals 420 in response to the calibration mode signal MODE indicating a calibration mode, wherein a value of each successive plurality of bit signals 420 is based on the final-stage output voltage $V_{OUT}$ at the final-stage voltage output 330 (block 506). The process 500 also includes the automatic calibration circuit 408 converting each successive plurality of bit signals 420 into an analog calibration signal CAL on a calibration input 414 coupled to at least one of the at least one front-end auxiliary differential input pair 312 comprising a first front-end auxiliary differential input pair 312(1) and a second front-end auxiliary differential input pair 312(2), and the final-stage auxiliary differential input pair 326, based on the final-stage output voltage $V_{OUT}$ in response to the calibration mode signal MODE indicating the calibration mode (block 508). The process 500 also includes the automatic calibration circuit 408 applying the analog calibration signal CAL on the calibration input 414 in response to the calibration mode signal MODE indicating the amplify mode (block 510).

Figure 6:
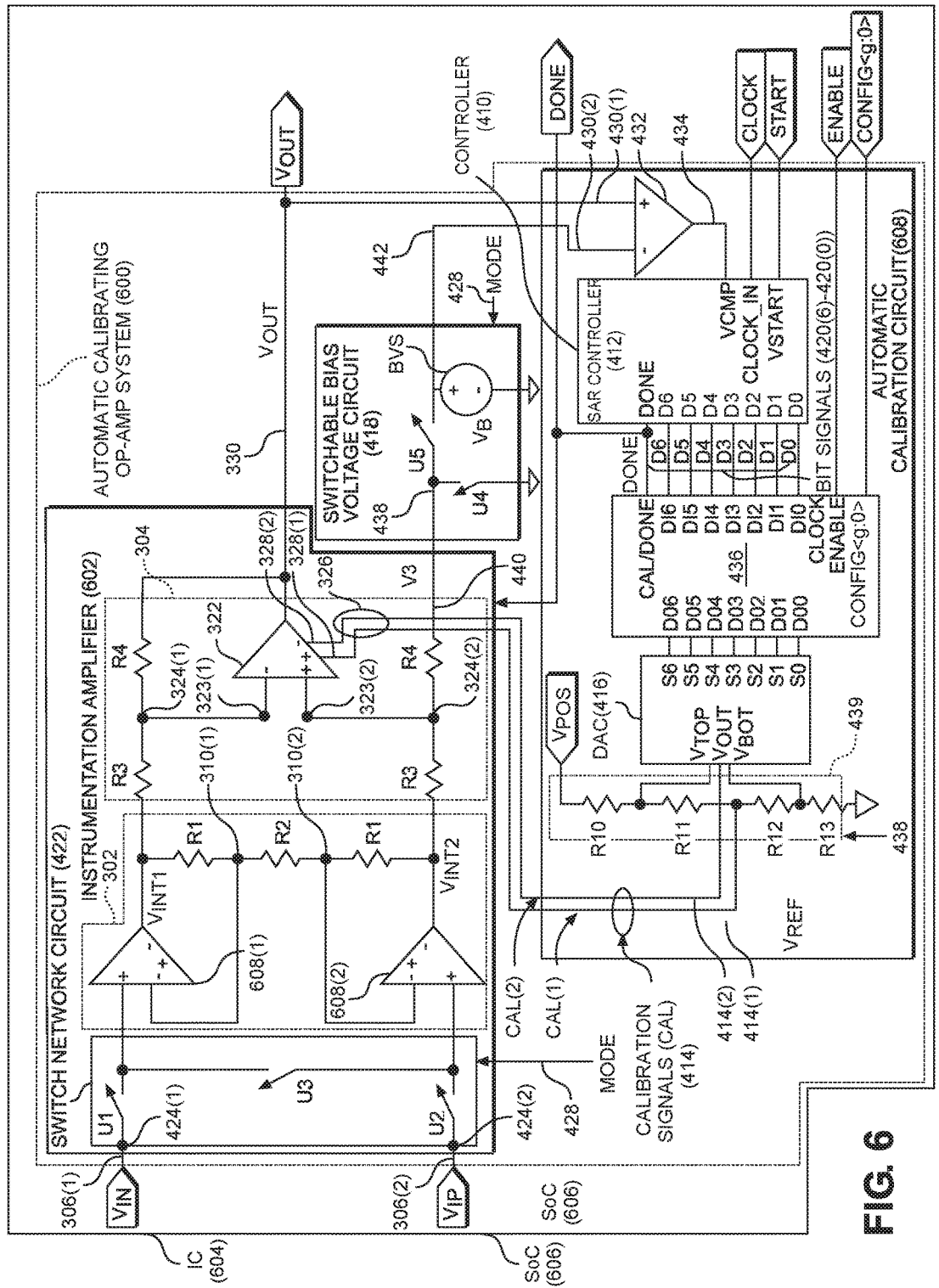
FIG. 6 is a schematic diagram of another alternative automatic calibrating op-amp system that includes an instrumentation amplifier and an automatic calibration circuit employing a single controller configured to generate calibration signals to the auxiliary differential inputs of a final-stage op-amp in the instrumentation amplifier to reduce or cancel offset voltage in the instrumentation amplifier.
Figure 6A:
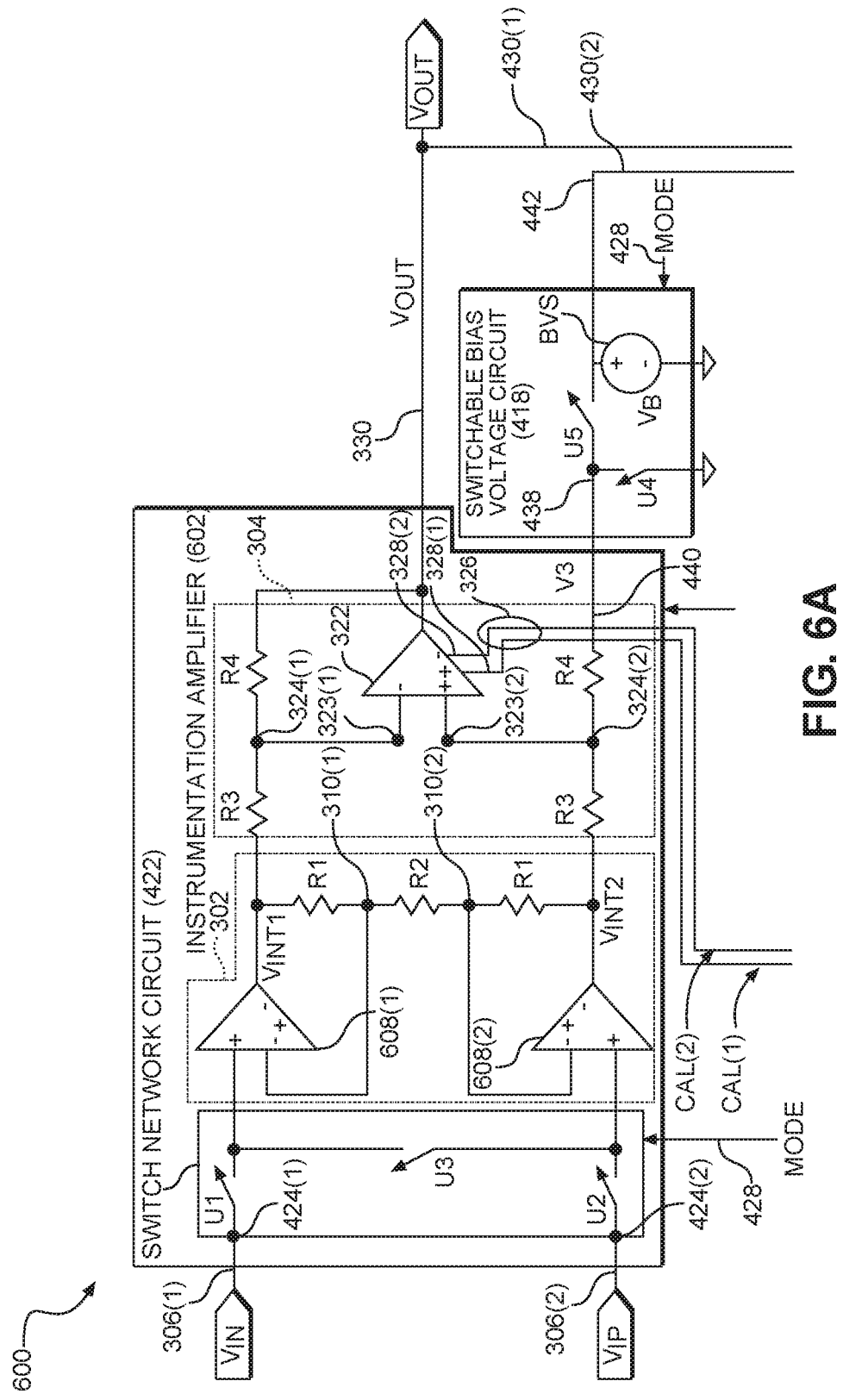
FIG. 6A is a schematic diagram illustrating the instrumentation amplifier and an optional switchable bias voltage circuit in the automatic calibrating op-amp system in FIG. 6.
Figure 6B:
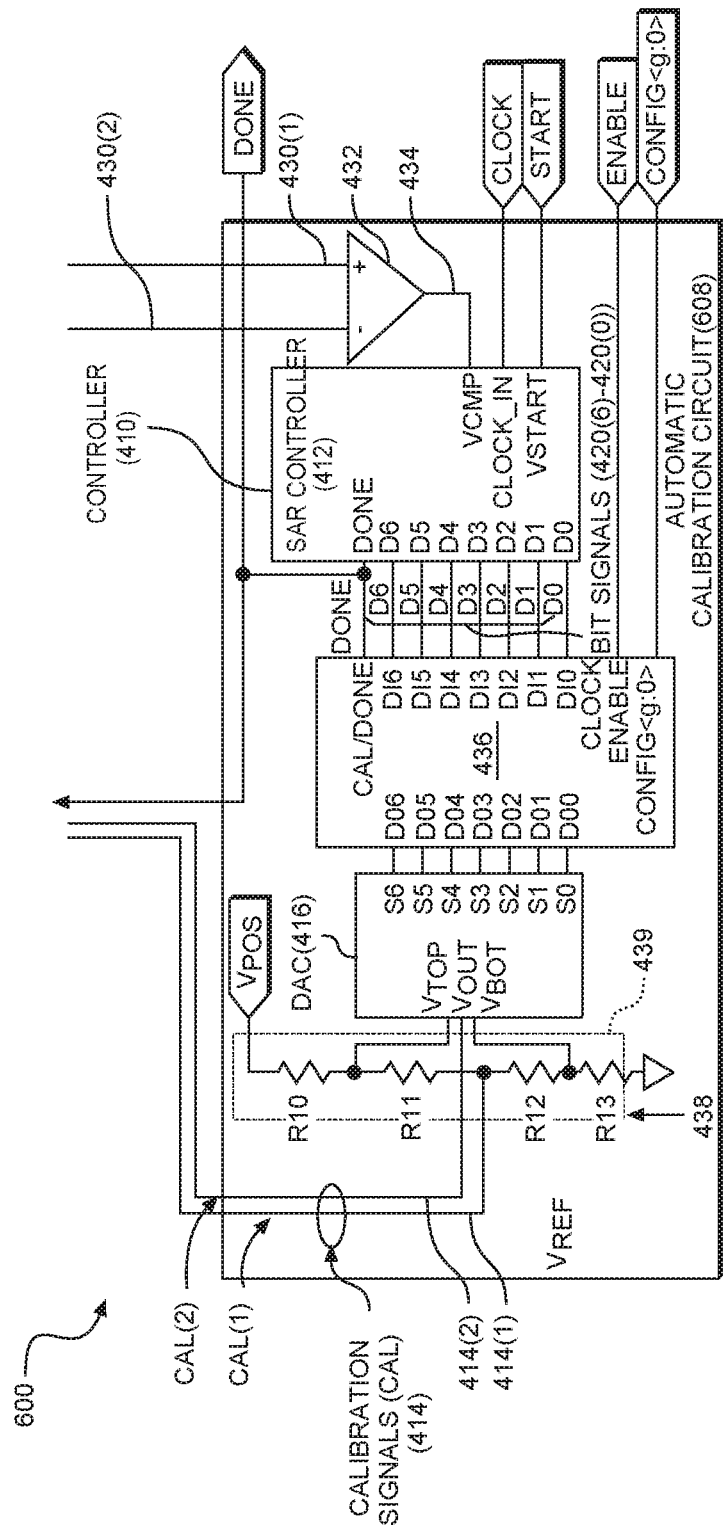
FIG. 6B is a schematic diagram illustrating a single controller, automatic calibration circuit in the automatic calibrating op-amp system in FIG. 6.

FIG. 6 is a schematic diagram of another automatic calibrating op-amp system 600 that includes an instrumentation amplifier 602 similar to the instrumentation amplifiers 300, 402 in FIGS. 3 and 4. The instrumentation amplifier 602 is provided as an IC 604, which may be a SoC 606 for example. Common elements between the instrumentation amplifier 602 in FIG. 6 and the instrumentation amplifiers 300, 402 in FIGS. 3 and 4 are shown with common element numbers. The first and second front-end op-amps 308(1), 308(2) in the instrumentation amplifier 602 do not show the respective additional first and second front-end auxiliary differential input pairs 312(1), 312(2) for offset voltage cancellation in FIG. 6. The final-stage op-amp 322 in the instrumentation amplifier 602 is shown to include the additional final-stage auxiliary differential input pair 326 for offset voltage cancellation. FIG. 6A is a schematic diagram illustrating the instrumentation amplifier 602 and optional switchable bias voltage circuit 418 in more detail in the automatic calibrating op-amp system 600 in FIG. 6 in more detail. FIG. 6B is a schematic diagram illustrating the automatic calibration circuit 408 (which is the same automatic calibration circuit 408 in FIG. 4) in the automatic calibrating op-amp system 600 in FIG. 6 in more detail.

With reference to FIGS. 6 and 6A, the first and second front-end op-amps 308(1), 308(2) in the instrumentation amplifier 602 do not show the respective additional first and second front-end auxiliary differential input pairs 312(1), 312(2) for offset like shown in FIGS. 3 and 4. In this regard, as illustrated in FIG. 6, the final-stage auxiliary differential inputs 328(1), 328(2) of the final-stage op-amp 322 are coupled to the respective calibration inputs 414(1), 414(2) of the automatic calibration circuit 408.

Depending on the gain of the front-end amplifier circuit 302 of the instrumentation amplifier 602 (2R1+R2)/R2, the dynamic range required from the DAC 416 of the automatic calibration circuit 408 may be larger than required for the application. For a given DAC 416 resolution, a larger dynamic range will result in larger least significant bits (LSBs) for the DAC 416 and therefore may yield less precision in offset voltage nullification of the instrumentation amplifier 602.

The operation of the switch network circuit 422, the switchable bias voltage circuit 418, and the automatic calibration circuit 408 in FIGS. 6-6B are as previously described in FIGS. 4 and 4B, and thus will not be repeated here.

Figure 7:
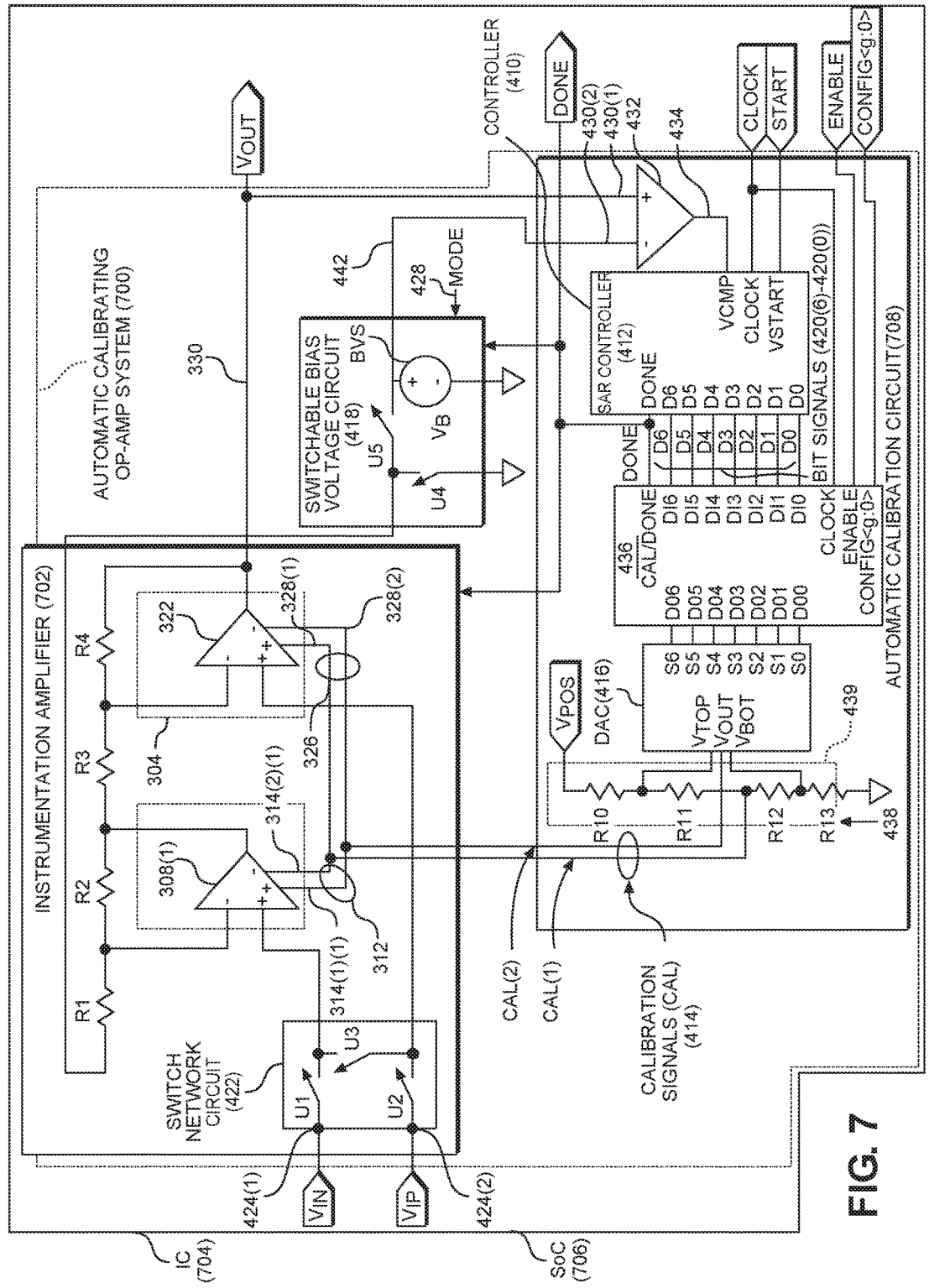
FIG. 7 is a schematic diagram of another alternative automatic calibrating op-amp system that includes an instrumentation amplifier and an automatic calibration circuit employing a single controller configured to generate calibration signals to the auxiliary differential inputs of a front-end and a final-stage op-amp in the instrumentation amplifier to reduce or cancel offset voltage in the instrumentation amplifier.
Figure 7A:
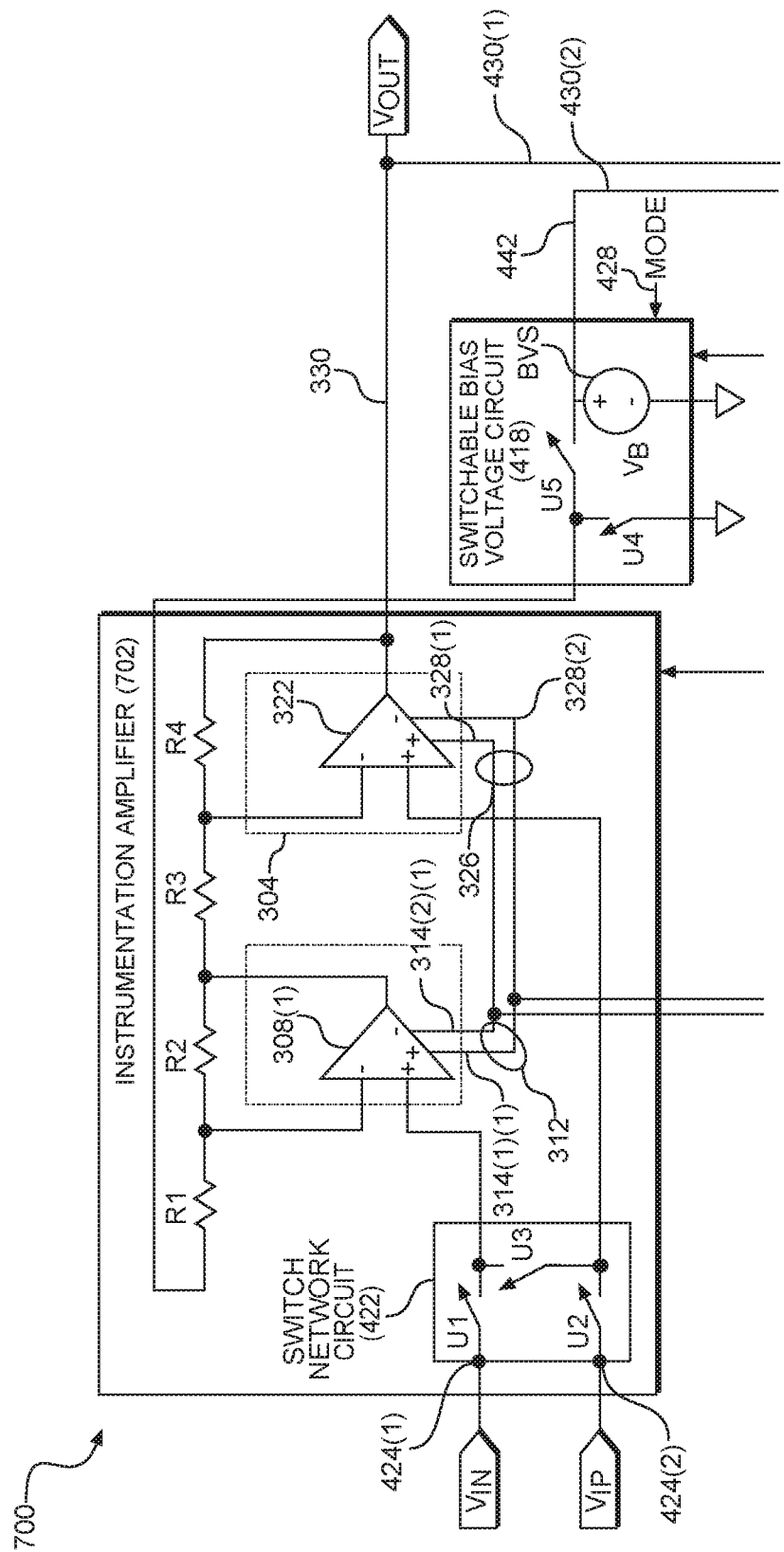
FIG. 7A is a schematic diagram illustrating the instrumentation amplifier and an optional switchable bias voltage circuit in the automatic calibrating op-amp system in FIG. 7.
Figure 7B:
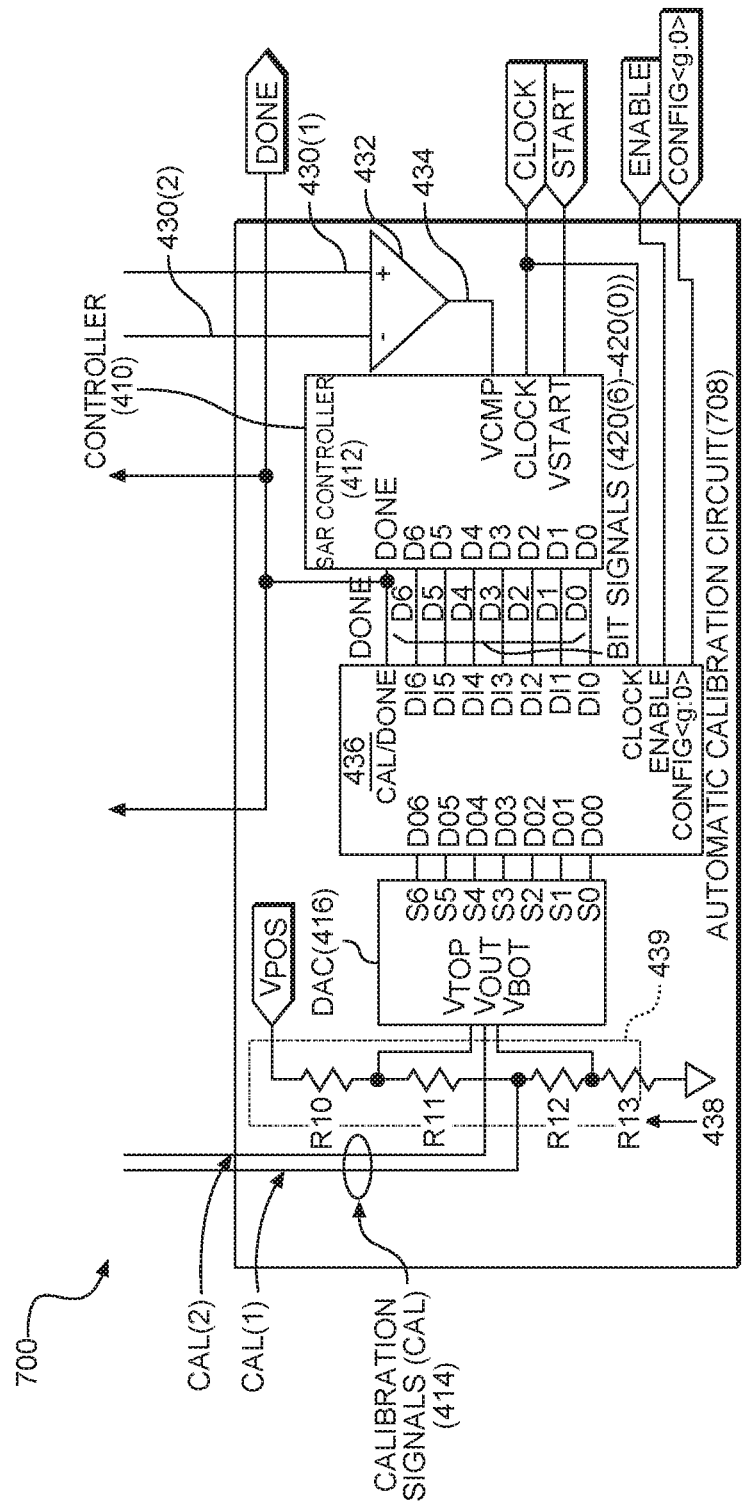
FIG. 7B is a schematic diagram illustrating single controller, automatic calibration circuit in the automatic calibrating op-amp system in FIG. 7.

FIG. 7 is a schematic diagram of another automatic calibrating op-amp system 700 that includes an instrumentation amplifier 702 similar to the instrumentation amplifiers 300, 402, 602 in FIGS. 3, 4, and 6. The instrumentation amplifier 702 is provided as an IC 704, which may be a SoC 706 for example. Common elements between the instrumentation amplifier 702 in FIG. 7 and the instrumentation amplifiers 300, 402, 602 in FIGS. 3, 4, and 6 are shown with common element numbers. The instrumentation amplifier 702 includes the first front-end op-amp 308(1) and the final-stage op-amp 322, but does not include the second front-end op-amp 308(2) included in the instrumentation amplifiers 300, 402, 602 in FIGS. 3, 4, and 6. FIG. 7A is a schematic diagram illustrating the instrumentation amplifier 702 and optional switchable bias voltage circuit 418 in more detail in the automatic calibrating op-amp system 700 in FIG. 7 in more detail. FIG. 7B is a schematic diagram illustrating the automatic calibration circuit 408 (which is the same automatic calibration circuit 408 in FIG. 4) in the automatic calibrating op-amp system 700 in FIG. 7 in more detail.

With reference to FIGS. 7 and 7A, the calibration inputs 414(1), 414(2) are coupled to the first front-end auxiliary differential input pairs 312(1), 312(2) of the first front-end op-amp 308(1) and the final-stage auxiliary differential input pair 326 of the final-stage op-amp 322. The operation of the switch network circuit 422, the switchable bias voltage circuit 418, and the automatic calibration circuit 408 in FIGS. 6-6B are as previously described in FIGS. 4 and 4B, and thus will not be repeated here.

Figure 8:
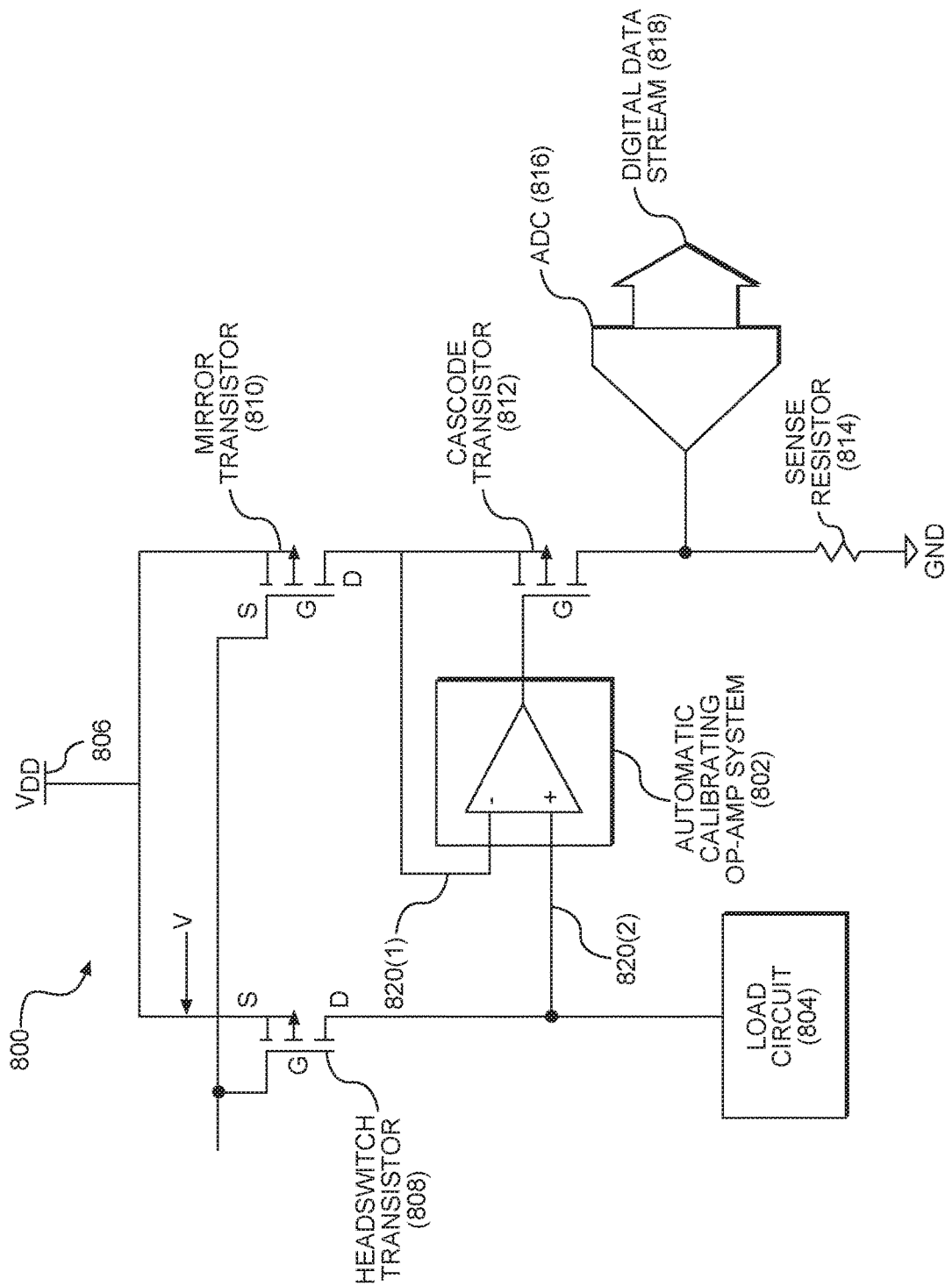
FIG. 8 is a diagram of an exemplary on-die current measurement (ODCM) system used to measure a power supply current of a load circuit, wherein the ODCM system can employ an automatic calibrating op-amp system that includes an instrumentation amplifier including an op-amp(s) that includes additional auxiliary differential inputs for offset voltage cancellation, which can include the automatic calibrating op-amp systems in FIGS. 4, 6, and 7, to reduce the effects of offset voltages on the measured power supply current.

Further, an example circuit that may employ an automatic calibrating op-amp systems employing an instrumentation amplifier and a single controller automatic calibration is an on-die current measurement (ODCM) circuit 800 illustrated in FIG. 8. As shown in FIG. 8, the ODCM circuit 800 includes an automatic calibrating op-amp system 802. The automatic calibrating op-amp system 802 in FIG. 8 may be designed to use an op-amp with extremely high low frequency gain or an instrumentation amplifier. For example, the automatic calibrating op-amp system 802 could be the automatic calibrating op-amp systems 400, 600, or 700 in FIG. 4, 6, or 7, respectively. The ODCM circuit 800 is used to measure a power supply current (not shown) of a load circuit 804. To measure such a current, the ODCM circuit 800 includes a voltage source 806 that supplies an input voltage $V_{DD}$ to a source S of a headswitch transistor 808. The headswitch transistor 808 provides power control to the load circuit 804 by allowing a voltage signal (V) to reach the load circuit 804. The voltage source 806 also provides the input voltage $V_{DD}$ to a source S of a mirror transistor 810, which is sized to be a fraction of the width of the headswitch transistor 808. Both the headswitch transistor 808 and the mirror transistor 810 are biased deep in a field-effect transistor (FET) triode region, effectively making them function as low-value resistors. Further, a cascode transistor 812 controls a voltage across the mirror transistor 810, causing a current to flow through the cascode transistor 812 to a sense resistor 814. A voltage is generated across the sense resistor 814 such that an analog-to-digital converter (ADC) 816 can generate a digital data stream 818 that represents the power supply current of the load circuit 804.

With continuing reference to FIG. 8, in order for the ODCM system 800 to function properly, the headswitch transistor 808 and the mirror transistor 810 need to have precisely equal drain-source voltages. In this manner, the automatic calibrating op-amp system 802, together with the cascode transistor 812, forces the drain-source voltage of the mirror transistor 810 to equal that of the headswitch transistor 808. Notably, the automatic calibrating op-amp system 802 is configured to receive a first input voltage (not shown) on a first voltage input 820(1) from the mirror transistor 810, and a second input voltage (not shown) on a second voltage input 820(2) from the load circuit 804. More specifically, the automatic calibrating op-amp system 802 controls the cascode transistor 812 in order to keep the voltage across the mirror transistor 810 equal to the voltage across the headswitch transistor 808. Thus, the drain-source voltages of the mirror transistor 810 and the headswitch transistor 808 are kept equal to one another. However, in this example, the headswitch transistor 808 is relatively large compared to the mirror transistor 810, and the drain-source voltage of the headswitch transistor 808 is relatively small. Thus, with the effects of a composite offset voltage $V_{OFFSET}$ associated with the automatic calibrating op-amp system 802 being canceled or negligible as discussed in the examples of the automatic calibrating op-amp systems 400, 600, and 700 in FIGS. 4, 6, and 7, then the automatic calibrating op-amp system 802 will not disturb the drain-source voltage of the mirror transistor 810. In this manner, the drain-source voltage of the mirror transistor 810 will be precisely equal to that of the headswitch transistor 808, because the automatic calibrating op-amp system 802 can be configured to compensate (i.e., negate) the effects of the composite offset voltage $V_{OFESET}$.

Further, the circuits and elements described herein are sometimes referred to as means for performing particular functions. In this regard, an automatic calibrating op-amp system can be provided. The automatic calibrating op-amp system can comprise a means for generating at least one intermediate output voltage on at least one front-end voltage output based on a first input voltage and a second input voltage in an instrumentation amplifier, and at least one front-end offset voltage coupled to at least one front-end auxiliary differential input pair. Examples of the means for generating at least one intermediate output voltage on at least one front-end voltage output can include the front-end amplifier circuit 302, the first front-end op-amp 308(1), and/or the second front-end op-amp 308(2), in the instrumentation amplifiers 300, 402, 602, and 702 in FIGS. 3, 4, 6, and 7. The automatic calibrating op-amp system can also comprise a means for generating a final-stage output voltage on a final-stage voltage output based on the at least one intermediate output voltage, and at least one final-stage offset voltage coupled to at least one final-stage auxiliary differential input pair. Examples of the means for generating a final-stage output voltage on a final-stage voltage output can include the final-stage amplifier circuit 304 and/or the final-stage op-amp 322 in the instrumentation amplifiers 300, 402, 602, and 702 in FIGS. 3, 4, 6, and 7. The automatic calibrating op-amp system can also comprise a means for automatically calibrating comprising a calibration output coupled to at least one of the at least one front-end auxiliary differential input pair comprising a first front-end auxiliary differential input pair and a second front-end auxiliary differential input pair, and the at least one final-stage auxiliary differential input pair. The means for automatically calibrating can comprise a means for successively generating a plurality of bit signals in response to a calibration signal indicating a calibration mode, wherein a value of each successive plurality of bit signals is based on the final-stage output voltage at the final-stage voltage output. Examples of the means for successively generating the plurality of bit signals include the automatic calibration circuit 408, the controller 410, and/or the SAR controller 412 in the automatic calibrating op-amp systems 400, 600, and 700 in FIGS. 4, 6, and 7. The means for automatically calibrating can comprise a means for converting each of the plurality of bit signals into an analog calibration signal comprising an offset voltage on the calibration output based on the final-stage output voltage, in response to the calibration mode signal indicating the calibration mode. Examples of the means for converting include the DAC 416 in the automatic calibration circuit 408 in FIGS. 4, 6, and 7. The means for automatically calibrating can comprise a means for applying the analog calibration signal on the calibration output in response to the calibration signal indicating an amplify mode. Examples of the means for applying the analog calibration signal on the calibration output can include the automatic calibration circuit 408 and/or the DAC 416 in the automatic calibrating op-amp systems 400, 600, and 700 in FIGS. 4, 6, and 7.

An automatic calibrating op-amp system that includes an instrumentation amplifier that includes an additional auxiliary differential input(s) in an op-amp(s) for offset voltage cancellation and an automatic calibration circuit employing a single controller configured to generate calibration signals to the auxiliary differential input(s) of the op-amp(s) in the instrumentation amplifier to reduce or cancel offset voltage in the instrumentation amplifier, including but not limited to the automatic calibrating op-amp systems 400, 600, and 700 in FIGS. 4, 6, and 7, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 9:
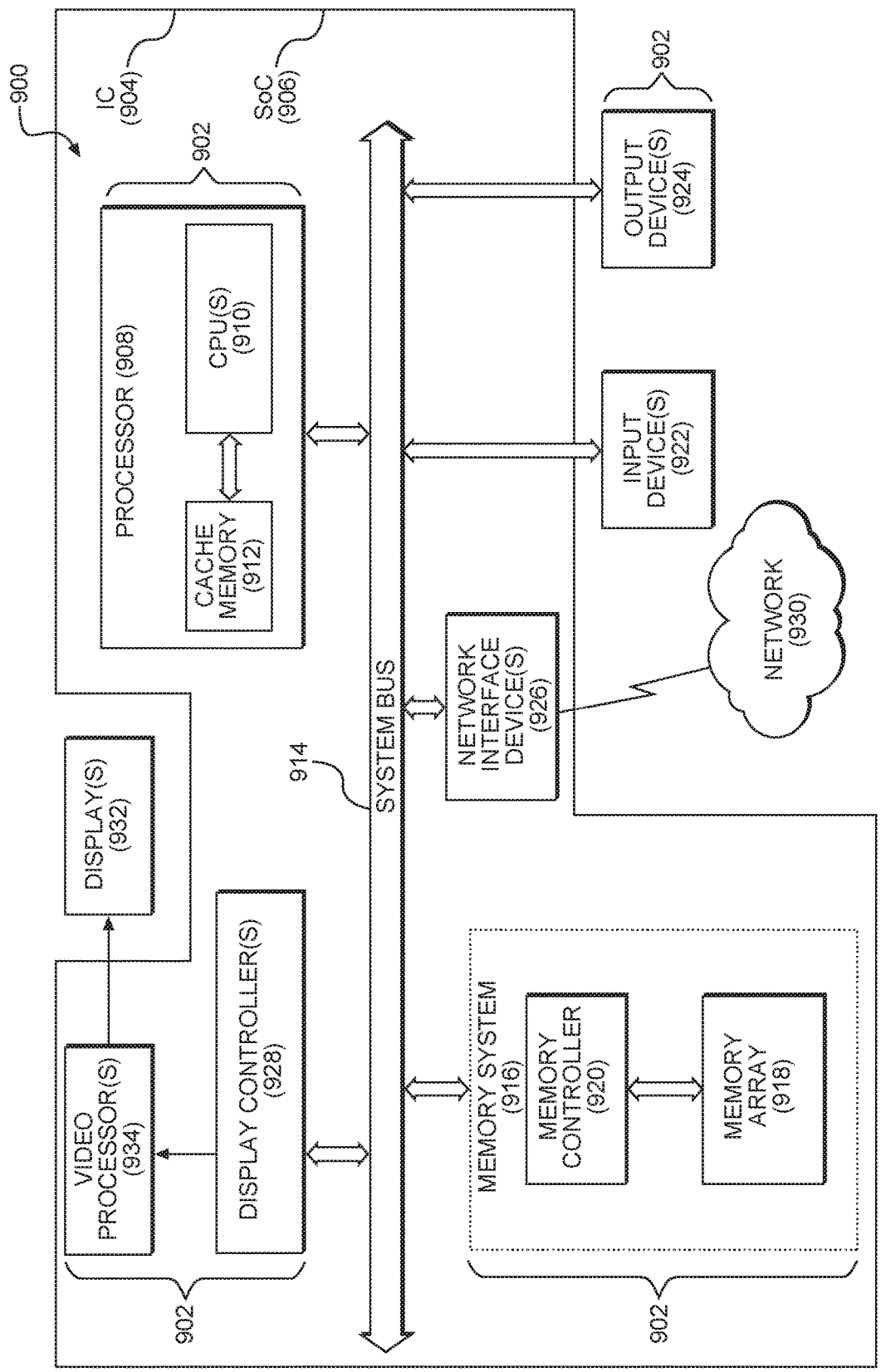
FIG. 9 is a block diagram of an exemplary processor-based system that can include an automatic calibrating op-amp system that includes an instrumentation amplifier that includes an additional auxiliary differential input(s) in an op-amp(s) for offset voltage cancellation and an automatic calibration circuit employing a single controller configured to generate calibration signals to the auxiliary differential input(s) of the op-amp(s) in the instrumentation amplifier to reduce or cancel offset voltage in the instrumentation amplifier, including but not limited to the automatic calibrating op-amp systems in FIGS. 4, 6, and 7.

In this regard, FIG. 9 illustrates an example of a processor-based system 900 that can include an automatic calibrating op-amp system 902 that includes an instrumentation amplifier that includes an additional auxiliary differential input(s) in an op-amp(s) for offset voltage cancellation and an automatic calibration circuit employing a single controller configured to generate calibration signals to the auxiliary differential input(s) of the op-amp(s) in the instrumentation amplifier to reduce or cancel offset voltage in the instrumentation amplifier, including but not limited to the automatic calibrating op-amp systems 400, 600, and 700 in FIGS. 4, 6, and 7. In this example, the processor-based system 900 is included in an IC 904, which may be a SoC 906. The processor-based system 900 includes a processor 908 that includes one or more central processing units (CPUs) 910. The processor 908 may include a cache memory 912 accessible by the CPUs 910 for rapid access to temporarily stored data. The processor 908 is coupled to a system bus 914 and can intercouple master and slave devices included in the processor-based system 900. As is well known, the processor 908 communicates with these other devices by exchanging address, control, and data information over the system bus 914. For example, the processor 908 can communicate bus transaction requests to a memory system 916 that includes a memory array 918 controlled by a memory controller 920 as an example of a slave device. Although not illustrated in FIG. 9, multiple system buses 914 could be provided, wherein each system bus 914 constitutes a different fabric.

Other master and slave devices can be connected to the system bus 914. As illustrated in FIG. 9, these devices can include the memory system 916, one or more input devices 922, one or more output devices 924, one or more network interface devices 926, and one or more display controllers 928, as examples. Each of the one or more input devices 922, the one or more output devices 924, the one or more network interface devices 926, and the one or more display controllers 928 can include an automatic calibrating op-amp system 902 that includes an instrumentation amplifier that includes an additional auxiliary differential input(s) in an op-amp(s) for offset voltage cancellation and an automatic calibration circuit employing a single controller configured to generate calibration signals to the auxiliary differential input(s) of the op-amp(s) in the instrumentation amplifier to reduce or cancel offset voltage in the instrumentation amplifier, including but not limited to the automatic calibrating op-amp systems 400, 600, and 700 in FIGS. 4, 6, and 7. The input device(s) 922 can include any type of input device, including, but not limited to, input keys, switches, voice processors, etc. The output device(s) 924 can include any type of output device, including, but not limited to, audio, video, other visual indicators, etc. The network interface device(s) 926 can be any device configured to allow exchange of data to and from a network 930. The network 930 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 926 can be configured to support any type of communications protocol desired.

The processor 908 may also be configured to access the display controller(s) 928 over the system bus 914 to control information sent to one or more displays 932. The display controller(s) 928 sends information to the display(s) 932 to be displayed via one or more video processors 934, which process the information to be displayed into a format suitable for the display(s) 932. The display(s) 932 can include any type of display, including, but not limited to, a cathode ray tube (CRT), a liquid crystal display (LCD), a plasma display, a light emitting diode (LED) display, etc.

Figure 10:
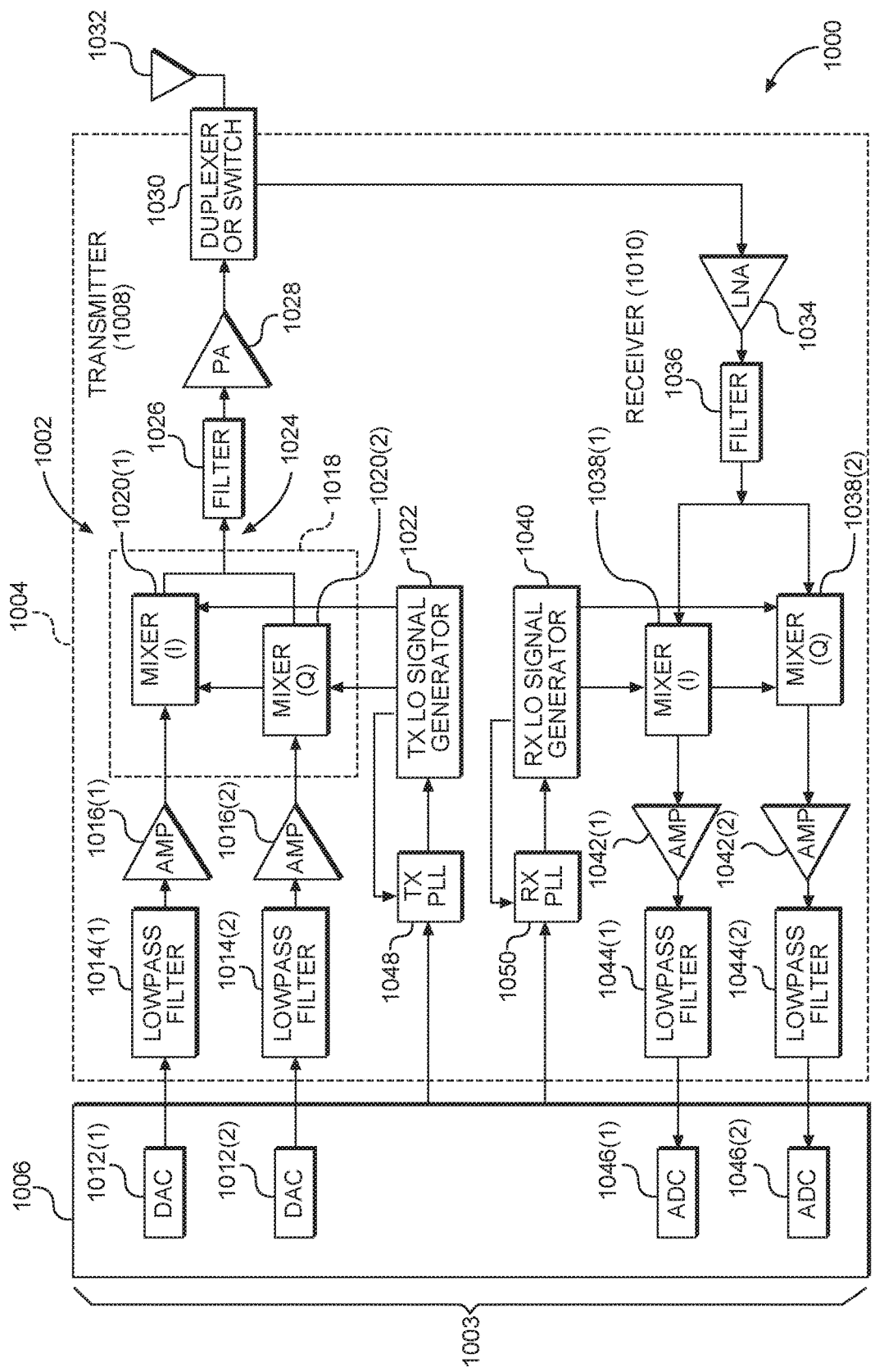
FIG. 10 is a block diagram of an exemplary wireless communications device that includes radio frequency (RF) components formed in an integrated circuit (IC), wherein the wireless communications device can include an automatic calibrating op-amp system that includes an instrumentation amplifier that includes an additional auxiliary differential input(s) in an op-amp(s) for offset voltage cancellation and an automatic calibration circuit employing a single controller configured to generate calibration signals to the auxiliary differential input(s) of the op-amp(s) in the instrumentation amplifier to reduce or cancel offset voltage in the instrumentation amplifier, including but not limited to the automatic calibrating op-amp systems in FIGS. 4, 6, and 7.

FIG. 10 illustrates an exemplary wireless communications device 1000 that includes radio frequency (RF) components formed in an IC 1002, wherein any of the components therein can include an automatic calibrating op-amp system 1003 that includes an instrumentation amplifier that includes an additional auxiliary differential input(s) in an op-amp(s) for offset voltage cancellation and an automatic calibration circuit employing a single controller configured to generate calibration signals to the auxiliary differential input(s) of the op-amp(s) in the instrumentation amplifier to reduce or cancel offset voltage in the instrumentation amplifier, including but not limited to the automatic calibrating op-amp systems 400, 600, and 700 in FIGS. 4, 6, and 7. In this regard, the wireless communications device 1000 may be provided in the IC 1002. The wireless communications device 1000 may include or be provided in any of the above referenced devices, as examples. As shown in FIG. 10, the wireless communications device 1000 includes a transceiver 1004 and a data processor 1006. The data processor 1006 may include a memory to store data and program codes. The transceiver 1004 includes a transmitter 1008 and a receiver 1010 that support bi-directional communications. In general, the wireless communications device 1000 may include any number of transmitters 1008 and/or receivers 1010 for any number of communication systems and frequency bands. All or a portion of the transceiver 1004 may be implemented on one or more analog ICs, RF ICs (RFICs), mixed-signal ICs, etc.

The transmitter 1008 or the receiver 1010 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1010. In the direct-conversion architecture, a signal is frequency-converted between RF and baseband in one stage. The super-heterodyne and direct-conversion architectures may use different circuit blocks and/or have different requirements. In the wireless communications device 1000 in FIG. 10, the transmitter 1008 and the receiver 1010 are implemented with the direct-conversion architecture.

In the transmit path, the data processor 1006 processes data to be transmitted and provides I and Q analog output signals to the transmitter 1008. In the exemplary wireless communications device 1000, the data processor 1006 includes digital-to-analog converters (DACs) 1012(1), 1012(2) for converting digital signals generated by the data processor 1006 into the I and Q analog output signals, e.g., I and Q output currents, for further processing.

Within the transmitter 1008, lowpass filters 1014(1), 1014(2) filter the I and Q analog output signals, respectively, to remove undesired signals caused by the prior digital-to-analog conversion. Amplifiers (AMP) 1016(1), 1016(2) amplify the signals from the lowpass filters 1014(1), 1014(2), respectively, and provide I and Q baseband signals. An upconverter 1018 upconverts the I and Q baseband signals with I and Q transmit (TX) local oscillator (LO) signals through mixers 1020(1), 1020(2) from a TX LO signal generator 1022 to provide an upconverted signal 1024. A filter 1026 filters the upconverted signal 1024 to remove undesired signals caused by the frequency upconversion as well as noise in a receive frequency band. A power amplifier (PA) 1028 amplifies the upconverted signal 1024 from the filter 1026 to obtain the desired output power level and provides a transmit RF signal. The transmit RF signal is routed through a duplexer or switch 1030 and transmitted via an antenna 1032.

In the receive path, the antenna 1032 receives signals transmitted by base stations and provides a received RF signal, which is routed through the duplexer or switch 1030 and provided to a low noise amplifier (LNA) 1034. The duplexer or switch 1030 is designed to operate with a specific receive (RX)-to-TX duplexer frequency separation, such that RX signals are isolated from TX signals. The received RF signal is amplified by the LNA 1034 and filtered by a filter 1036 to obtain a desired RF input signal. Down-conversion mixers 1038(1), 1038(2) mix the output of the filter 1036 with I and Q RX LO signals (i.e., LO_I and LO_Q) from an RX LO signal generator 1040 to generate I and Q baseband signals. The I and Q baseband signals are amplified by amplifiers (AMP) 1042(1), 1042(2) and further filtered by lowpass filters 1044(1), 1044(2) to obtain I and Q analog input signals, which are provided to the data processor 1006. In this example, the data processor 1006 includes ADCs 1046(1), 1046(2) for converting the analog input signals into digital signals to be further processed by the data processor 1006.

In the wireless communications device 1000 of FIG. 10, the TX LO signal generator 1022 generates the I and Q TX LO signals used for frequency upconversion, while the RX LO signal generator 1040 generates the I and Q RX LO signals used for frequency downconversion. Each LO signal is a periodic signal with a particular fundamental frequency. A TX phase-locked loop (PLL) circuit 1048 receives timing information from the data processor 1006 and generates a control signal used to adjust the frequency and/or phase of the TX LO signals from the TX LO signal generator 1022. Similarly, an RX PLL circuit 1050 receives timing information from the data processor 1006 and generates a control signal used to adjust the frequency and/or phase of the RX LO signals from the RX LO signal generator 1040.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An instrumentation amplifier, comprising:
    a gain resistor circuit coupled between a first resistor circuit node and a second resistor circuit node;
    a front-end amplifier circuit comprising:
        a first front-end operational amplifier (op-amp), comprising:
            a first front-end voltage input configured to receive a first input voltage on a first voltage input, and a second front-end voltage input coupled to the first resistor circuit node;
            a first front-end auxiliary differential input pair comprising a first front-end auxiliary differential input coupled to a first calibration input configured to receive a first calibration signal from a calibration circuit, and a second front-end auxiliary differential input coupled to a second calibration input configured to receive a second calibration signal from the calibration circuit; and
            a first front-end voltage output;
            the first front-end op-amp configured to generate a first intermediate output voltage on the first front-end voltage output based on the first input voltage and a voltage at the second front-end voltage input, and a first front-end offset voltage based on the first calibration signal applied to the first front-end auxiliary differential input and the second calibration signal applied to the second front-end auxiliary differential input;
        a second front-end op-amp, comprising:
            a third front-end voltage input configured to receive a second input voltage on a second voltage input, and a fourth front-end voltage input coupled to the second resistor circuit node;
            a second front-end auxiliary differential input pair comprising a third front-end auxiliary differential input coupled to the second calibration input, and a fourth front-end auxiliary differential input coupled to the first calibration input; and
            a second front-end voltage output;
            the second front-end op-amp configured to generate a second intermediate output voltage on the second front-end voltage output based on the second input voltage, and a voltage at the fourth front-end voltage input and a second front-end offset voltage based on the first calibration signal applied to the fourth front-end auxiliary differential input and the second calibration signal applied to the third front-end auxiliary differential input; and
    a final-stage amplifier circuit comprising a final-stage op-amp, comprising:
        a first final-stage voltage input configured to receive a first input voltage, and a second final-stage voltage input coupled to the first resistor circuit node; and
        a final-stage voltage output;
        the final-stage op-amp configured to generate a final-stage output voltage on the final-stage voltage output based on the first intermediate output voltage and the second intermediate output voltage.

2. The instrumentation amplifier of claim 1, further comprising:
    a first resistor circuit coupled between the first front-end voltage output and the first resistor circuit node; and
    a second resistor circuit coupled between the second front-end voltage output and the second resistor circuit node.

3. The instrumentation amplifier of claim 2, wherein the first resistor circuit comprises a first resistor having a first resistance and the second resistor circuit comprises a second resistor having a second resistance approximately equal to the first resistance.

4. The instrumentation amplifier of claim 1, further comprising:
    a third resistor circuit coupled between the first final-stage voltage input and the first front-end voltage output; and
    a fourth resistor circuit coupled between the second final-stage voltage input and the second front-end voltage output.

5. The instrumentation amplifier of claim 4, wherein the third resistor circuit comprises a third resistor having a third resistance and the fourth resistor circuit comprises a fourth resistor having a fourth resistance approximately equal to the third resistance.

6. The instrumentation amplifier of claim 1, further comprising a switch network circuit coupled to the first front-end voltage input and the second front-end voltage input, the switch network circuit comprising:
   a first switch voltage input configured to receive the first input voltage;
   a first switch circuit coupled between the first switch voltage input and the first front-end voltage input of the first front-end op-amp;
   a second switch voltage input configured to receive the first input voltage;
   a second switch circuit coupled between the second switch voltage input and the second front-end voltage input of the second front-end op-amp;
   a calibration switch circuit coupled between the first switch circuit and the second switch circuit; and
   a calibration mode input.

7. The instrumentation amplifier of claim 6, wherein, in response to the calibration mode input receiving a calibration mode signal indicating a calibration mode, the switch network circuit is configured to:
   open the first switch circuit or the second switch circuit to decouple the first voltage input from the first front-end voltage input of the first front-end op-amp, or decouple the second voltage input from the second front-end voltage input of the first front-end op-amp; and
   close the calibration switch circuit to short-circuit the first front-end voltage input of the first front-end op-amp to the second front-end voltage input of the second front-end op-amp.

8. The instrumentation amplifier of claim 6, wherein, in response to the calibration mode input receiving a calibration mode signal indicating an amplify mode, the switch network circuit is configured to:
   close the first switch circuit and the second switch circuit to couple the first voltage input to the first front-end voltage input of the first front-end op-amp, and couple the second voltage input to the second front-end voltage input of the second front-end op-amp; and
   open the calibration switch circuit to decouple the first front-end voltage input of the first front-end op-amp from the second front-end voltage input of the second front-end op-amp.

9. The instrumentation amplifier of claim 1 integrated into an integrated circuit (IC).

10. The instrumentation amplifier of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

11. An automatic calibrating operational amplifier (op-amp) system, comprising:
   an instrumentation amplifier, comprising:
      at least one front-end amplifier circuit, comprising:
         a first front-end voltage input configured to receive a first input voltage on a first voltage input;
         a second front-end voltage input configured to receive a second input voltage on a second voltage input;
         at least one front-end auxiliary differential input pair; and
         at least one front-end voltage output;
         the at least one front-end amplifier circuit configured to generate at least one intermediate output voltage on the at least one front-end voltage output based on the first input voltage and the second input voltage, and at least one front-end offset voltage based on a plurality of calibration signals applied to the at least one front-end auxiliary differential input pair;
      a final-stage amplifier circuit comprising a final-stage op-amp, comprising:
         a first final-stage voltage input configured to receive a first final-stage input voltage, and a second final-stage voltage input coupled to a first resistor circuit node;
         a final-stage auxiliary differential input pair; and
         a final-stage voltage output;
         the final-stage op-amp configured to generate a final-stage output voltage on the final-stage voltage output based on the at least one first intermediate output voltage, and a final-stage offset voltage applied to the final-stage auxiliary differential input pair; and
   an automatic calibration circuit coupled to the final-stage voltage output of the instrumentation amplifier, the automatic calibration circuit comprising:
      a single successive approximation register (SAR) controller configured to successively generate a plurality of bit signals in response to a calibration mode signal on a calibration mode input indicating a calibration mode, wherein a value of each successive plurality of bit signals is based on the final-stage output voltage at the final-stage voltage output; and
      a digital-to-analog converter (DAC) comprising a calibration output coupled to at least one of the at least one front-end auxiliary differential input pair comprising a first front-end auxiliary differential input pair and a second front-end auxiliary differential input pair, and the final-stage auxiliary differential input pair, the DAC configured to:
         convert each successive plurality of bit signals into a plurality of analog calibration signals on the calibration output based on the final-stage output voltage in response to the calibration mode signal indicating the calibration mode; and
         apply the plurality of analog calibration signals on the calibration output in response to the calibration mode signal indicating an amplify mode to compensate for a composite offset voltage of the instrumentation amplifier.

12. The automatic calibrating op-amp system of claim 11, wherein:
   the at least one front-end amplifier circuit is configured to generate the at least one intermediate output voltage on the at least one front-end voltage output based on a difference between the first input voltage and the second input voltage, and the at least one front-end offset voltage based on the plurality of calibration signals applied to the at least one front-end auxiliary differential input pair; and the final-stage op-amp is configured to generate the final-stage output voltage on the final-stage voltage output based on a difference between the at least one intermediate output voltage, and the final-stage offset voltage applied to the final-stage auxiliary differential input pair.

13. The automatic calibrating op-amp system of claim 11, wherein:

the at least one front-end amplifier circuit comprises:
a first front-end op-amp, comprising:
a first front-end voltage input configured to receive the first input voltage and a second front-end input voltage; and
a first front-end auxiliary differential input pair comprising a first front-end auxiliary differential input coupled to a first calibration input configured to receive a first calibration signal among the plurality of calibration signals, and a second front-end auxiliary differential input coupled to a second calibration input configured to receive a second calibration signal among the plurality of calibration signals;
a first front-end voltage output;
the first front-end op-amp configured to generate a first intermediate output voltage on the first front-end voltage output based on the first input voltage and a voltage at the second front-end voltage input, and a first front-end offset voltage based on the first calibration signal applied to the first front-end auxiliary differential input and the second calibration signal applied to the second front-end auxiliary differential input; and
a second front-end op-amp, comprising:
a third front-end voltage input configured to receive the second input voltage, and a fourth front-end voltage input;
a second front-end auxiliary differential input pair comprising a third front-end auxiliary differential input coupled to the second calibration input and a fourth front-end auxiliary differential input coupled to the first calibration input; and
a second front-end voltage output;
the second front-end op-amp configured to generate a second intermediate output voltage on the second front-end voltage output based on the second input voltage and a voltage at the fourth front-end voltage input, and a second front-end offset voltage based on the first calibration signal applied to the fourth front-end auxiliary differential input and the second calibration signal applied to the third front-end auxiliary differential input;
the final-stage amplifier circuit comprises a final-stage op-amp, comprising:
the first final-stage voltage input configured to receive the first input voltage and the second final-stage voltage input; and
the final-stage voltage output;
the final-stage op-amp configured to generate the final-stage output voltage on the final-stage voltage output based on the first intermediate output voltage and the second intermediate output voltage; and the DAC comprises the calibration output coupled to the first front-end auxiliary differential input pair and the second front-end auxiliary differential input pair.

14. The automatic calibrating op-amp system of claim 11, wherein:

the DAC comprises the calibration output coupled to the final-stage auxiliary differential input pair; and
the final-stage amplifier circuit comprises the final-stage op-amp, comprising:
the first final-stage voltage input configured to receive the first final-stage input voltage and a second final-stage voltage input; and
the final-stage voltage output;
the final-stage op-amp configured to generate the final-stage output voltage on the final-stage voltage output based on the at least one first intermediate output voltage, and the final-stage offset voltage applied to the final-stage auxiliary differential input pair.

15. The automatic calibrating op-amp system of claim 11, wherein:

the at least one front-end amplifier circuit comprises:
a first front-end op-amp, comprising:
a first front-end voltage input configured to receive the first input voltage and the second front-end voltage input;
a first front-end auxiliary differential input pair comprising a first front-end auxiliary differential input coupled to a first calibration input configured to receive a first calibration signal among the plurality of calibration signals, and a second front-end auxiliary differential input coupled to a second calibration input configured to receive a second calibration signal among the plurality of calibration signals; and
a first front-end voltage output;
the first front-end op-amp configured to generate a first intermediate output voltage on the first front-end voltage output based on the first input voltage and the second front-end voltage input based on the first intermediate output voltage, and a first front-end offset voltage based on the first calibration signal applied to the first front-end auxiliary differential input and the second calibration signal applied to the second front-end auxiliary differential input;
the final-stage amplifier circuit comprises the final-stage op-amp, comprising:
the first final-stage voltage input configured to receive the first final-stage input voltage and a second final-stage voltage input; and
the final-stage voltage output;
the final-stage op-amp configured to generate the final-stage output voltage on the final-stage voltage output based on the first intermediate output voltage and a final-stage input voltage based on the final-stage output voltage; and
the DAC comprises the calibration output coupled to the first front-end auxiliary differential input pair and the final-stage auxiliary differential input pair.

16. The automatic calibrating op-amp system of claim 11, further comprising a switchable bias voltage circuit comprising:

a bias voltage input coupled to a node of the instrumentation amplifier configured to have an input voltage substantially equal to the final-stage output voltage;
a bias voltage output coupled to a bias voltage supply and the automatic calibration circuit;

a ground switch coupled to the bias voltage input and a ground node, and coupled to the calibration mode input; and a bias switch coupled to the bias voltage input and the bias voltage output, and coupled to the calibration mode input.

17. The automatic calibrating op-amp system of claim 16, wherein:

in response to the calibration mode signal on the calibration mode input indicating the calibration mode:
the bias switch is configured to be activated to couple a bias voltage from the bias voltage supply to the automatic calibration circuit; and
the ground switch is configured to be deactivated to decouple the ground node from the bias voltage input; and in response to the calibration mode signal on the calibration mode input indicating an amplify mode:
the ground switch is configured to be activated to couple the ground node to the bias voltage input; and
the bias switch is configured to be deactivated to decouple the bias voltage from the bias voltage supply to the automatic calibration circuit.

18. The automatic calibrating op-amp system of claim 17, wherein:

the automatic calibration circuit further comprises a calibration op-amp comprising a first voltage input coupled to the final-stage voltage output, a second voltage input coupled to the bias voltage output, and a voltage output node coupled to the single SAR controller;

the calibration op-amp is configured to generate a calibration voltage on the voltage output node based on the final-stage output voltage on the first voltage input and the bias voltage supply on the bias voltage on the second voltage input; and the single SAR controller is configured to successively generate the plurality of bit signals in response to the calibration mode signal on the calibration mode input indicating the calibration mode, wherein a value of each successive plurality of bit signals is based on an output voltage on the voltage output node of the calibration op-amp.

19. The automatic calibrating op-amp system of claim 11, wherein the single SAR controller comprises:

a voltage compare input configured to receive an op-amp output voltage signal; and
a plurality of bit signal outputs configured to provide the successive plurality of bit signals to the DAC.

20. The automatic calibrating op-amp system of claim 19, wherein the DAC comprises the plurality of bit signal inputs configured to receive the successive plurality of bit signals.

21. The automatic calibrating op-amp system of claim 19, wherein the automatic calibration circuit further comprises:

a first switch configured to be activated in response to the calibration mode signal indicating the amplify mode;
a second switch configured to be activated in response to the calibration mode signal indicating the calibration mode, wherein:
the automatic calibration circuit is further configured to, in response to the calibration mode signal indicating the amplify mode:
couple the first input voltage to a first primary input in response to activation of the first switch; and
couple the second input voltage to a second primary input in response to deactivation of the second switch; and the automatic calibration circuit further configured to, in response to the calibration mode signal indicating the calibration mode:
couple a primary offset voltage to the first primary input in response to deactivation of the first switch; and
couple the primary offset voltage to the second primary input in response to activation of the second switch.

22. The automatic calibrating op-amp system of claim 21, wherein the SAR controller further comprises:

a start input configured to receive a start signal; and
a clock input configured to receive a clock signal;
the SAR controller further configured to successively generate the plurality of bit signals by being configured to:
generate the plurality of bit signals in response to the start signal; and
generate the plurality of bit signals such that one bit signal is generated in a cycle of the clock signal.

23. The automatic calibrating op-amp system of claim 11, wherein the DAC is further configured to:

receive a top reference voltage;
receive a bottom reference voltage; and
generate an analog calibration signal among the plurality of analog calibration signals by being configured to generate the analog calibration signal with a voltage between the top reference voltage and the bottom reference voltage.

24. The automatic calibrating op-amp system of claim 11 integrated into an integrated circuit (IC).

25. The automatic calibrating op-amp system of claim 11 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

26. An automatic calibrating operational amplifier (op-amp) system, comprising:

a means for generating at least one intermediate output voltage on at least one front-end voltage output based on a first input voltage and a second input voltage in an instrumentation amplifier, and at least one front-end offset voltage coupled to at least one front-end auxiliary differential input pair;

a means for generating a final-stage output voltage on a final-stage voltage output based on the at least one intermediate output voltage, and at least one final-stage offset voltage coupled to at least one final-stage auxiliary differential input pair; and a means for automatically calibrating comprising a calibration output coupled to at least one of the at least one front-end auxiliary differential input pair comprising a first front-end auxiliary differential input pair and a second front-end auxiliary differential input pair, and the at least one final-stage auxiliary differential input pair, the means for automatically calibration comprising a means for:

successively generating a plurality of bit signals in response to a calibration mode signal indicating a calibration mode, wherein a value of each successive plurality of bit signals is based on the final-stage output voltage at the final-stage voltage output;

converting each successive plurality of bit signals into an analog calibration signal comprising an offset voltage on the calibration output based on the final-stage output voltage, in response to the calibration mode signal indicating the calibration mode; and applying the analog calibration signal on the calibration output in response to the calibration mode signal indicating an amplify mode.

27. A method of automatically calibrating an offset voltage in an instrumentation amplifier, comprising:

generating at least one intermediate output voltage on at least one front-end voltage output based on a first input voltage and a second input voltage, and at least one front-end offset voltage based on a calibration signal applied to at least one front-end auxiliary differential input pair;

generating a final-stage output voltage on a final-stage voltage output based on the at least one intermediate output voltage, and a final-stage offset voltage based on the calibration signal applied to a final-stage auxiliary differential input pair;

successively generating a plurality of bit signals in response to a calibration mode signal indicating a calibration mode, wherein a value of each successive plurality of bit signals is based on the final-stage output voltage at the final-stage voltage output;

converting each successive plurality of bit signals into an analog calibration signal on a calibration output coupled to at least one of the at least one front-end auxiliary differential input pair comprising a first front-end auxiliary differential input pair and a second front-end auxiliary differential input pair, and the final-stage auxiliary differential input pair, based on the final-stage output voltage in response to the calibration mode signal indicating the calibration mode; and applying the analog calibration signal on the calibration output in response to the calibration mode signal indicating an amplify mode.

28. The method of claim 27, wherein:

generating the at least one intermediate output voltage on the at least one front-end voltage output comprises:

generating a first intermediate output voltage on a first front-end voltage output based on the first input voltage and a voltage at a second front-end voltage input, and a first front-end offset voltage based on a first calibration signal applied to the first front-end auxiliary differential input pair and a second calibration signal applied to the second front-end auxiliary differential input pair; and generating a second intermediate output voltage on a second front-end voltage output based on the second input voltage and a voltage at a fourth front-end voltage input, and a second front-end offset voltage based on the first calibration signal applied to a fourth front-end auxiliary differential input pair and the second calibration signal applied to a third front-end auxiliary differential input pair;

generating the final-stage output voltage on the final-stage voltage output comprises generating the final-stage output voltage on the final-stage voltage output based on the first intermediate output voltage and the second intermediate output voltage, and the final-stage offset voltage based on the calibration signal applied to the final-stage auxiliary differential input pair; and converting each successive plurality of bit signals into the analog calibration signal comprises converting each successive plurality of bit signals into the analog calibration signal on the calibration output coupled to the first front-end auxiliary differential input pair and the second front-end auxiliary differential input pair, based on the final-stage output voltage in response to the calibration mode signal indicating the calibration mode.

29. The method of claim 27, wherein:

generating the final-stage output voltage on the final-stage voltage output comprises generating the final-stage output voltage on the final-stage voltage output based on a first intermediate output voltage, and the final-stage offset voltage based on the calibration signal applied to the final-stage auxiliary differential input pair; and converting each successive plurality of bit signals into the analog calibration signal comprises converting each successive plurality of bit signals into the analog calibration signal on the calibration output coupled to the final-stage auxiliary differential input pair, based on the final-stage output voltage in response to the calibration mode signal indicating the calibration mode.

30. The method of claim 27, wherein:

generating the at least one intermediate output voltage on the at least one front-end voltage output comprises:

generating a first intermediate output voltage on a first front-end voltage output based on the first input voltage and a voltage at a second front-end voltage input, and a first front-end offset voltage based on a first calibration signal applied to the first front-end auxiliary differential input pair and a second calibration signal applied to the second front-end auxiliary differential input pair;

generating the final-stage output voltage on the final-stage voltage output comprises generating the final-stage output voltage on the final-stage voltage output based on the first intermediate output voltage, and the final-stage offset voltage based on the calibration signal applied to the final-stage auxiliary differential input pair; and converting each successive plurality of bit signals into the analog calibration signal comprises converting each successive plurality of bit signals into the analog calibration signal on the calibration output coupled to the first front-end auxiliary differential input pair and the final-stage auxiliary differential input pair, based on the final-stage output voltage in response to the calibration mode signal indicating the calibration mode.

* * * * *